(12) United States Patent
Wu et al.

(10) Patent No.: US 10,573,497 B2
(45) Date of Patent: Feb. 25, 2020

(54) MULTI-LAYER PLASMA RESISTANT COATING BY ATOMIC LAYER DEPOSITION

(71) Applicant: Applied Materials, Inc., Santa Clara, CA (US)

(72) Inventors: Xiaowei Wu, San Jose, CA (US); David Fenwick, Los Altos Hills, CA (US); Jennifer Y. Sun, Mountain View, CA (US); Guodong Zhan, Woodlands, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/849,253

(22) Filed: Dec. 20, 2017

(65) Prior Publication Data

US 2018/0209042 A1  Jul. 26, 2018

Related U.S. Application Data

(63) Continuation of application No. 15/411,892, filed on Jan. 20, 2017.

(51) Int. Cl.
| | |
|---|---|
| *C23C 16/455* | (2006.01) |
| *H01J 37/32* | (2006.01) |
| *C23C 16/06* | (2006.01) |
| *C23C 16/50* | (2006.01) |

(Continued)

(52) U.S. Cl.
CPC ........ *H01J 37/32495* (2013.01); *C23C 16/06* (2013.01); *C23C 16/403* (2013.01); *C23C 16/45527* (2013.01); *C23C 16/45529* (2013.01); *C23C 16/45544* (2013.01); *C23C 16/45565* (2013.01); *C23C 16/50* (2013.01); *H01J 37/3244* (2013.01); *H01J 2237/334* (2013.01); *H01J 2237/335* (2013.01);
(Continued)

(58) Field of Classification Search
CPC ............................................... C23C 16/45527
See application file for complete search history.

(56) References Cited

U.S. PATENT DOCUMENTS

| | | |
|---|---|---|
| 5,630,314 A | 5/1997 | Kojima et al. |
| 5,805,973 A | 9/1998 | Coffinberry |
| 5,840,434 A | 11/1998 | Kojima et al. |

(Continued)

FOREIGN PATENT DOCUMENTS

| | | |
|---|---|---|
| CN | 1906026 A | 1/2007 |
| CN | 101218376 A | 7/2008 |

(Continued)

OTHER PUBLICATIONS

Putkonen (Chemical Vapor Deposition 2001, 7, 44-50).

(Continued)

*Primary Examiner* — Elizabeth A Burkhart
(74) *Attorney, Agent, or Firm* — Lowenstein Sandler LLP

(57) ABSTRACT

Described herein are articles, systems and methods where a plasma resistant coating is deposited onto a surface of a chamber component using an atomic layer deposition (ALD) process. The plasma resistant coating has a stress relief layer and a layer comprising a solid solution of $Y_2O_3$—$ZrO_2$ and uniformly covers features, such as those having an aspect ratio of about 3:1 to about 300:1.

16 Claims, 12 Drawing Sheets

(51) Int. Cl.
*C23C 16/40* (2006.01)
*H01L 21/67* (2006.01)

(52) U.S. Cl.
CPC . *H01J 2237/3321* (2013.01); *H01L 21/67028* (2013.01); *H01L 21/67069* (2013.01)

(56) References Cited

U.S. PATENT DOCUMENTS

| | | | |
|---|---|---|---|
| 6,139,983 A | 10/2000 | Ohashi et al. | |
| 6,548,424 B2 * | 4/2003 | Putkonen | C23C 16/405 438/785 |
| 6,632,549 B1 | 10/2003 | Ohashi et al. | |
| 6,641,941 B2 | 11/2003 | Yamada et al. | |
| 6,685,991 B2 | 2/2004 | Wataya et al. | |
| 6,777,353 B2 | 8/2004 | Putkonen | |
| 6,858,332 B2 | 2/2005 | Yamada | |
| 6,858,546 B2 | 2/2005 | Niinisto et al. | |
| 6,916,534 B2 | 7/2005 | Wataya et al. | |
| 7,138,192 B2 | 11/2006 | Yamada et al. | |
| 7,351,658 B2 | 4/2008 | Putkonen | |
| 7,384,696 B2 | 6/2008 | Hayasaki et al. | |
| 7,498,272 B2 | 3/2009 | Niinisto et al. | |
| 7,560,376 B2 | 7/2009 | Escher et al. | |
| 7,569,280 B2 | 8/2009 | Hayasaki et al. | |
| 7,696,117 B2 | 4/2010 | Sun et al. | |
| 7,754,621 B2 | 7/2010 | Putkonen | |
| 7,780,786 B2 | 8/2010 | Mitsuhashi et al. | |
| 7,968,205 B2 | 6/2011 | Nakano et al. | |
| 7,998,883 B2 | 8/2011 | Putkonen | |
| 8,399,862 B2 | 3/2013 | Ohmi et al. | |
| 8,619,406 B2 | 12/2013 | Cho et al. | |
| 8,858,745 B2 | 10/2014 | Sun et al. | |
| 8,916,021 B2 | 12/2014 | Sun et al. | |
| 9,012,030 B2 | 4/2015 | Han et al. | |
| 9,090,046 B2 | 7/2015 | Sun et al. | |
| 9,343,289 B2 | 5/2016 | Sun et al. | |
| 9,394,615 B2 | 7/2016 | Sun et al. | |
| 9,440,886 B2 | 9/2016 | Sun et al. | |
| 9,551,070 B2 | 1/2017 | Chang et al. | |
| 9,617,188 B2 | 4/2017 | Sun et al. | |
| 9,617,633 B2 | 4/2017 | He et al. | |
| 9,633,884 B2 | 4/2017 | He et al. | |
| 9,850,573 B1 * | 12/2017 | Sun | C23C 16/4404 |
| 2002/0177001 A1 | 11/2002 | Harada et al. | |
| 2003/0029563 A1 | 2/2003 | Kaushal | |
| 2003/0051811 A1 | 3/2003 | Uchimaru et al. | |
| 2004/0023811 A1 | 2/2004 | Iijima | |
| 2005/0227118 A1 | 10/2005 | Uchimaru et al. | |
| 2006/0037536 A1 | 2/2006 | Kobayashi et al. | |
| 2006/0073354 A1 | 4/2006 | Watanabe et al. | |
| 2008/0066647 A1 | 3/2008 | Harada et al. | |
| 2008/0213496 A1 | 9/2008 | Sun et al. | |
| 2008/0254231 A1 * | 10/2008 | Lin | C23C 16/403 427/576 |
| 2008/0264565 A1 | 10/2008 | Sun et al. | |
| 2009/0194233 A1 | 8/2009 | Tamura | |
| 2010/0119843 A1 * | 5/2010 | Sun | H01J 37/32477 428/426 |
| 2010/0119844 A1 | 5/2010 | Sun et al. | |
| 2010/0129670 A1 | 5/2010 | Sun et al. | |
| 2010/0323124 A1 | 12/2010 | Vartabedian et al. | |
| 2011/0091700 A1 | 4/2011 | Simpson | |
| 2012/0135155 A1 | 5/2012 | Han et al. | |
| 2012/0138472 A1 | 6/2012 | Han | |
| 2013/0154059 A1 | 6/2013 | Ohmi et al. | |
| 2014/0116338 A1 | 5/2014 | He et al. | |
| 2014/0120312 A1 | 5/2014 | He et al. | |
| 2015/0004418 A1 | 1/2015 | Sun et al. | |
| 2015/0021324 A1 | 1/2015 | Sun et al. | |
| 2015/0024155 A1 | 1/2015 | Sun et al. | |
| 2015/0061237 A1 | 3/2015 | Sun et al. | |
| 2015/0064450 A1 | 3/2015 | Sun et al. | |
| 2015/0152540 A1 | 6/2015 | Sato et al. | |
| 2015/0158775 A1 | 6/2015 | Sun et al. | |
| 2015/0299050 A1 * | 10/2015 | Sun | B32B 18/00 216/52 |
| 2015/0307982 A1 | 10/2015 | Firouzdor et al. | |
| 2015/0311043 A1 | 10/2015 | Sun et al. | |
| 2015/0311044 A1 | 10/2015 | Sun et al. | |
| 2015/0321964 A1 | 11/2015 | Sun et al. | |
| 2015/0329955 A1 | 11/2015 | Sun et al. | |
| 2016/0079040 A1 | 3/2016 | Park et al. | |
| 2016/0181627 A1 * | 6/2016 | Roeder | H01M 8/021 429/516 |
| 2016/0211121 A1 | 7/2016 | Sun et al. | |
| 2016/0273095 A1 | 9/2016 | Lin et al. | |
| 2016/0312351 A1 | 10/2016 | Liu et al. | |
| 2016/0326625 A1 | 11/2016 | Sun et al. | |
| 2016/0326626 A1 | 11/2016 | Sun et al. | |
| 2016/0336210 A1 | 11/2016 | Cooke | |
| 2016/0375515 A1 | 12/2016 | Xu et al. | |
| 2016/0379806 A1 | 12/2016 | Xu et al. | |
| 2017/0022595 A1 | 1/2017 | Sato et al. | |
| 2017/0110293 A1 | 4/2017 | Sun et al. | |
| 2017/0140969 A1 | 5/2017 | Kuo | |
| 2018/0044800 A1 | 2/2018 | Hendrix et al. | |

FOREIGN PATENT DOCUMENTS

| | | |
|---|---|---|
| CN | 105074889 A | 11/2015 |
| CN | 105088141 A | 11/2015 |
| CN | 105225997 A | 1/2016 |
| CN | 2071933910 U | 4/2018 |
| JP | H03115535 | 5/1991 |
| JP | 2006082474 | 3/2006 |
| JP | 2007131951 | 5/2007 |
| JP | 2007217782 | 8/2007 |
| KR | 20170044396 | 4/2017 |
| WO | 2013032260 | 3/2013 |
| WO | 2015120265 A1 | 8/2015 |

OTHER PUBLICATIONS

Pilvi (Chemical Vapor Deposition 2009, 15, 27-32).
Johansson, P. et al., "Atomic Layer Deposition Process for Barrier Applications of Flexible Packaging," 2010 Place Conference, Apr. 18-21, 2010, 33 pages, Albequerque, New Mexico.
Rowland, J.C. "Atomic Layer Depositions of the Al2O3—Y2O3 Pseudo-Binary System", Doctoral Dissertation, University of Florida, ProQuest LLC, 2010, pp. 1-106.

* cited by examiner

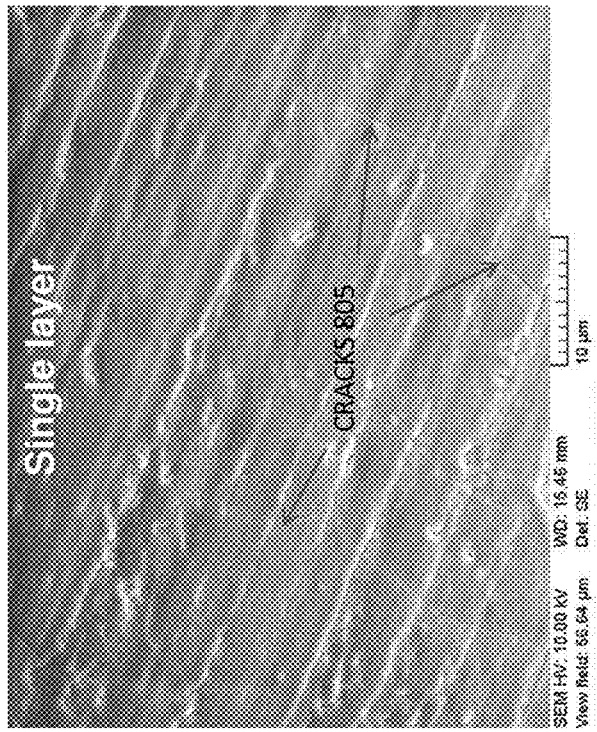
FIG. 7A
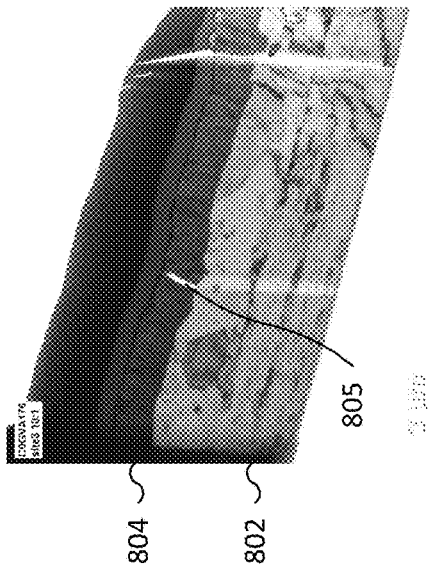
FIG. 8A
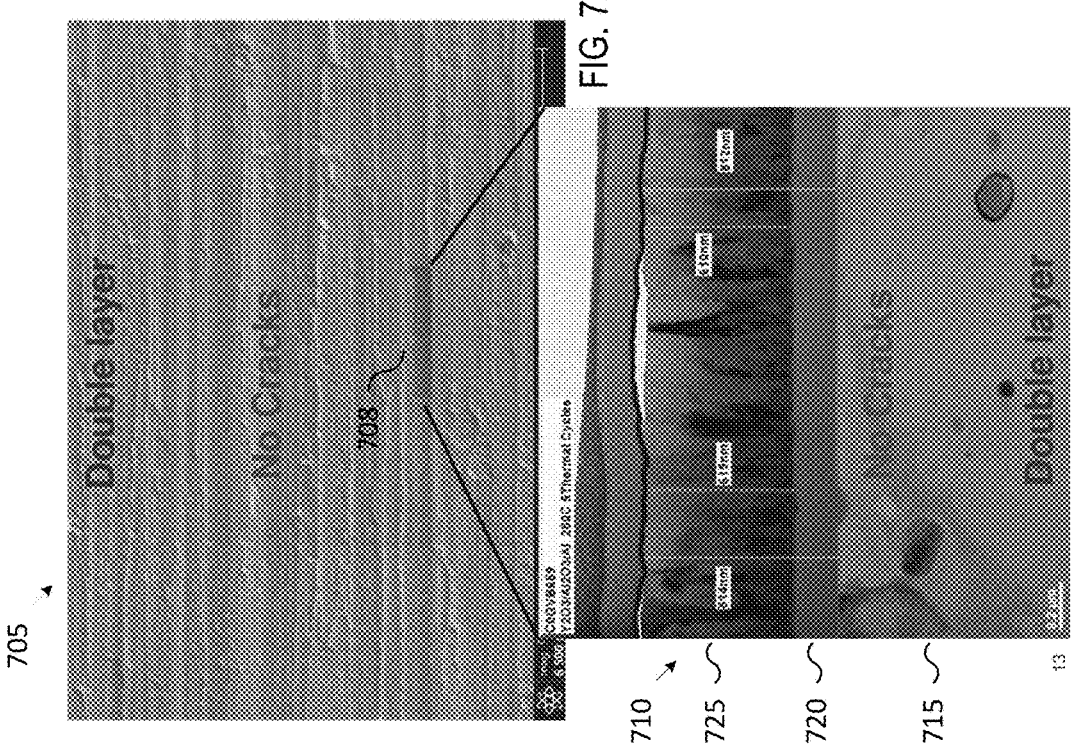
FIG. 7B
FIG. 8B

MULTI-LAYER PLASMA RESISTANT COATING BY ATOMIC LAYER DEPOSITION

RELATED APPLICATIONS

The present application is a continuation of U.S. patent application Ser. No. 15/411,892, filed Jan. 20, 2017, which is incorporated by reference herein.

TECHNICAL FIELD

Embodiments of the present disclosure relate to articles, coated chamber components and methods of coating chamber components with a multi-layer plasma resistant coating. The plasma ceramic coating has an amorphous stress relief layer and an oxide layer containing one or more rare earth metals such as a yttrium-containing oxide. Each layer of the coating is formed using atomic layer deposition.

BACKGROUND

Various manufacturing processes expose semiconductor process chamber components to high temperatures, high energy plasma, a mixture of corrosive gases, high stress, and combinations thereof. These extreme conditions may erode and/or corrode the chamber components, increasing the chamber components' susceptibility to defects. It is desirable to reduce these defects and improve the components' erosion and/or corrosion resistance in such extreme environments.

Protective coatings are typically deposited on chamber components by a variety of methods, such as thermal spray, sputtering, ion assisted deposition (IAD), plasma spray or evaporation techniques. These techniques cannot deposit coatings into certain features of the chamber components that have an aspect ratio of about 10:1 to about 300:1 (e.g., pits, shower head holes, etc.). Failure to coat such features may result in poor quality film, or a portion of the chamber component not being coated at all.

SUMMARY

Some of the embodiments described herein cover an article with a portion having an aspect ratio of about 3:1 to about 300:1. The article includes a plasma resistant coating on a surface of the portion of the article. The plasma resistant coating comprises an amorphous stress relief layer having a thickness of about 10 nm to about 1.5 µm and a rare earth metal-containing oxide layer having a thickness of about 10 nm to about 1.5 µm, wherein the rare earth metal-containing oxide layer covers the amorphous stress relief layer. The plasma resistant coating uniformly covers the portion, is resistant to cracking and delamination at a temperature of up to 300° C. and is porosity-free.

In some embodiments, a method includes depositing a plasma resistant coating onto a surface of a chamber component using an atomic layer deposition (ALD) process. The ALD process includes depositing an amorphous stress relief layer on the surface using ALD to a thickness of about 10 nm to about 1.5 µm and depositing a rare-earth metal-containing oxide layer on the stress relief layer using ALD to a thickness of about 10 nm to about 1.5 µm. The plasma resistant coating uniformly covers the surface of the chamber component, is resistant to cracking and delamination at a temperature of up to 350° C. and is porosity-free. In some embodiments, depositing the rare-earth metal-containing oxide comprises co-depositing a yttrium-containing oxide and an additional metal oxide to form a single phase yttrium-containing oxide layer. The co-depositing may be performed by co-injecting a mixture of a first precursor for the yttrium-containing oxide and a second precursor for the additional metal oxide into a deposition chamber containing the chamber component to cause the first precursor and the second precursor to adsorb onto a surface of the amorphous stress relief layer to form a first half reaction. Subsequently, an oxygen-containing reactant may be injected into the deposition chamber to form a second half reaction.

In some embodiments, a method includes depositing a plasma resistant coating onto a surface of a chamber component using an atomic layer deposition (ALD) process. The ALD process includes depositing an amorphous stress relief layer on the surface using a plurality of cycles of the ALD process to a thickness of about 10 nm to about 1.5 µm. The ALD process further includes subsequently depositing a stack of alternating layers of a rare earth metal-containing oxide and a second oxide to a thickness of about 10 nm to about 1.5 µm. Each of the layers of the rare earth metal-containing oxide are formed by performing about 1-30 cycles of the ALD process and has a thickness of about 1-100 angstroms. Each of the layers of the second oxide are formed by performing 1-2 cycles of the ALD process and has a thickness of about 0.5-4 angstroms. The layers of the second oxide prevent crystal formation in the layers of the rare earth metal-containing oxide.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 7A depicts a top down SEM image of a plasma resistant coating as described herein.

FIG. 7B depicts a TEM cross sectional image of the plasma resistant coating of FIG. 7A.

FIG. 8A depicts a top down SEM image of an ALD coating of $Y_2O_3$ without an $Al_2O_3$ stress relief layer on an article.

FIG. 8B depicts a cross sectional image of the ALD coating of FIG. 8A on the article.

DETAILED DESCRIPTION

Figure 1:
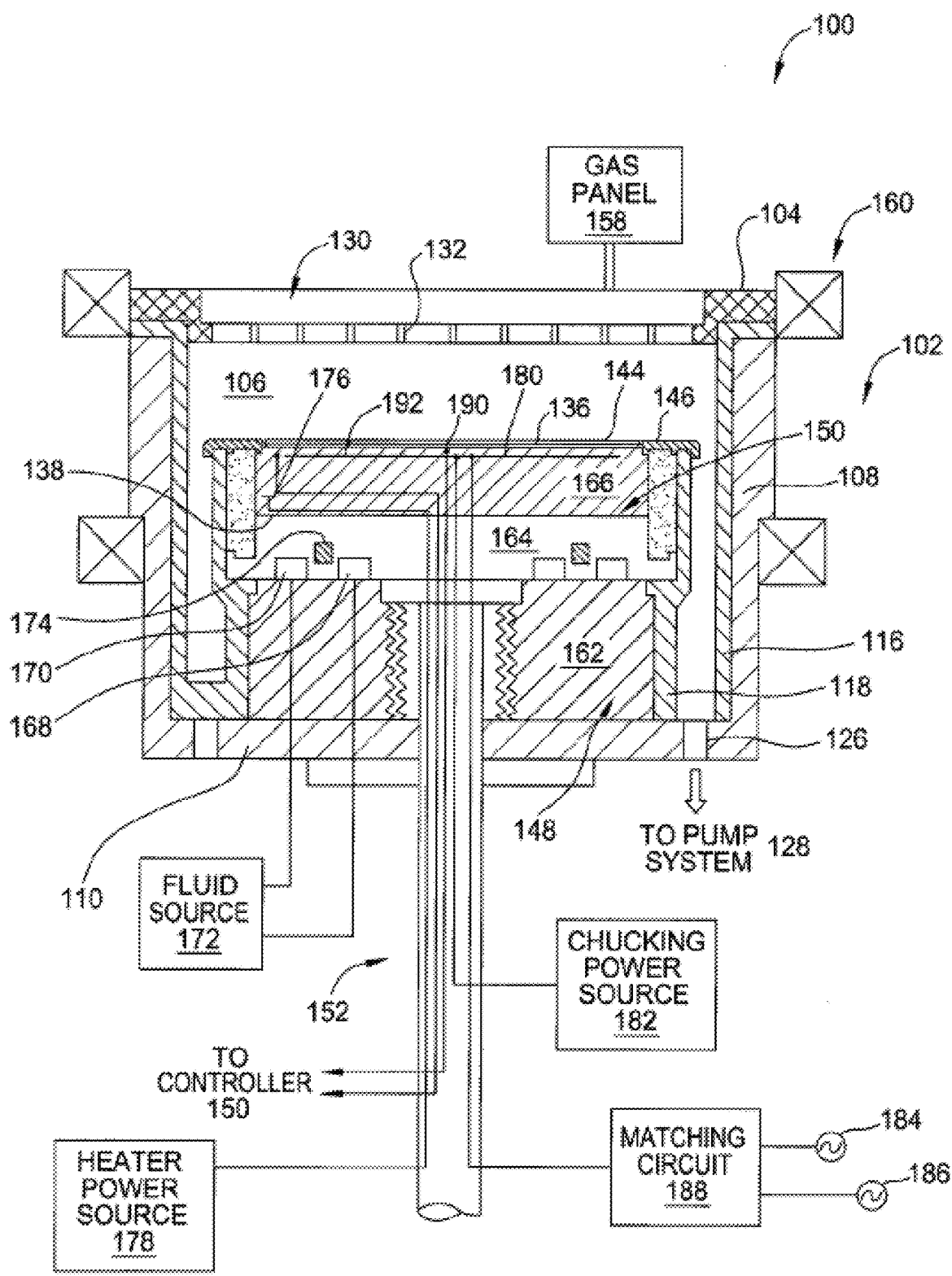
FIG. 1 depicts a sectional view of a processing chamber.

Embodiments described herein cover articles, coated chamber components and methods where a plasma resistant coating having a stress relief layer and a rare earth metal-containing oxide layer such as a yttrium-containing oxide layer are deposited on a surface of the components. As used herein, the term plasma resistant means resistant to plasma as well as chemistry and radicals. The surface may be an aluminum (e.g., Al 6061, Al 6063) or ceramic material. The deposition process is an atomic layer deposition (ALD) process that may include co-deposition of precursors for the rare earth metal-containing oxide layer. The plasma resistant coating may be comprised of a bi-layer stack. The bi-layer stack may include a stress relief layer of aluminum oxide ($Al_2O_3$), such as amorphous $Al_2O_3$, and a yttrium-containing oxide layer. Embodiments herein are described with a yttrium-containing oxide layer as an example. It will be appreciated that the top layer may include any rare earth metal oxide or single phase or multiple phase mixtures of rare earth metal oxides (i.e., with or without yttrium).

The thickness of each layer in the multi-layer plasma resistant coating may be from about 10 nm to about 1.5 μm. In embodiments, the stress relief layer (e.g., amorphous $Al_2O_3$) may have a thickness of about 1.0 μm and the rare earth metal-containing oxide layer may have a thickness of about 50 nm. A ratio of the rare earth metal-containing oxide layer thickness to the stress relief layer thickness may be 200:1 to 1:200. The thickness ratio may be selected in accordance with specific chamber applications. The coating may be annealed in order to create one, or more than one, intermediate layer comprising an interdiffused solid state phase between the two layers. The plasma resistant coating may coat or cover the surfaces of features in the article having an aspect ratio of about 10:1 to about 300:1. The plasma resistant coating may also conformally cover such features with a substantially uniform thickness. In one embodiment, the plasma resistant coating has a conformal coverage of the underlying surface that is coated (including coated surface features) with a uniform thickness having a thickness variation of less than about +/−20%, a thickness variation of +/−10%, a thickness variation of +/−5%, or a lower thickness variation.

Embodiments described herein enable high aspect ratio features of chamber components and other articles to be effectively coated with plasma resistant coatings having a stress relief layer (e.g., amorphous $Al_2O_3$) and a rare earth metal-containing oxide layer such as a yttrium-containing oxide layer (e.g., $Y_2O_3$ deposited in a single phase with another rare earth metal oxide) thereon. The plasma resistant coatings are conformal within the high aspect ratio feature and may cover the feature with a substantially uniform coating (e.g., with a thickness variation of about +/−5% or less). The plasma resistant coating is also very dense with a porosity of about 0% (e.g., the plasma resistant coating may be porosity-free in embodiments). The plasma resistant coatings having the stress relief layer and the rare earth metal-containing oxide layer may be resistant to corrosion and erosion from plasma etch chemistries, such as $CCl_4$/$CHF_3$ plasma etch chemistries, $HCl_3Si$ etch chemistries and $NF_3$ etch chemistries. Additionally, the plasma resistant coatings described herein having the stress relief layer and the rare earth metal-containing oxide layer may be resistant to cracking and delamination at temperatures up to about 350° C. For example, a chamber component having the plasma resistant coating described herein may be used in processes that include heating to temperatures of about 200° C. The chamber component may be thermally cycled between room temperature and the temperature of about 200° C. without introducing any cracks or delamination in the plasma resistant coating.

ALD allows for a controlled self-limiting deposition of material through chemical reactions with the surface of the article. Aside from being a conformal process, ALD is also a uniform process. All exposed sides of the article, including high aspect ratio features (e.g., about 10:1 to about 300:1) will have the same or approximately the same amount of material deposited. A typical reaction cycle of an ALD process starts with a precursor (i.e., a single chemical A) flooded into an ALD chamber and adsorbed onto the surface of the article. The excess precursor is then flushed out of the ALD chamber before a reactant (i.e., a single chemical R) is introduced into the ALD chamber and subsequently flushed out. The yttrium-containing oxide layer (or other rare earth metal oxide layer) in the ceramic coatings may, however, be formed by co-deposition of materials. To achieve this, a mixture of two precursors, such as a yttrium-containing oxide precursor (A) (e.g., $Y_2O_3$) and another rare earth metal oxide (B) precursor, are co-injected ($A_xB_y$) at any number of ratios, for example, A90+B10, A70+B30, A50+B50, A30+B70, A10+A90 and so on, into the chamber and adsorbed on the surface of the article. In these examples, x and y are expressed in molar ratios (mol %) for Ax+By. For example A90+B10 is 90 mol % of A and 10 mol % of B. Excess precursors are flushed out. A reactant is introduced into the ALD chamber and reacts with the adsorbed precursors to form a solid layer before the excess chemicals are flushed out. For ALD, the final thickness of material is dependent on the number of reaction cycles that are run, because each reaction cycle will grow a layer of a certain thickness that may be one atomic layer or a fraction of an atomic layer.

Unlike other techniques typically used to deposit coatings on components having high aspect ratio features, such as plasma spray coating and ion assisted deposition, the ALD technique can deposit a layer of material within such features (i.e., on the surfaces of the features). Additionally, the ALD technique produces relatively thin (i.e., 1 μm or less) coatings that are porosity-free (i.e., pin-hole free), which may eliminate crack formation during deposition. The term "porosity-free" as used herein means absence of any pores, pin-holes, voids, or cracks along the whole depth of the coating as measured by transmission electron microscopy (TEM). The TEM may be performed using a 100 nm thick TEM lamella prepared by focused ion beam milling, with the TEM operated at 200 kV in bright-field, dark-field, or high-resolution mode. In contrast, with conventional e-beam IAD or plasma spray techniques, cracks form upon deposition even at thicknesses of 5 or 10 μm and the porosity may be 1-3%.

Process chamber components, such as chamber walls, shower heads, nozzles, plasma generation units (e.g., radiofrequency electrodes with housings), diffusers and gas lines, would benefit from having these plasma resistant coatings to protect the components in harsh etch environments. Many of these chamber components have aspect ratios that range from about 10:1 to about 300:1, which makes them difficult to coat well using conventional deposition methods. Embodiments described herein enable high aspect ratio articles such as the aforementioned process chamber components to be coated with plasma resistant coatings that protect the articles. For example, embodiments enable the insides of gas lines, the insides of nozzles, the insides of holes in showerheads, and so on to be coated with a rare earth metal-containing oxide ceramic coating.

FIG. 1 is a sectional view of a semiconductor processing chamber 100 having one or more chamber components that are coated with a plasma resistant coating that has a stress relief layer and a rare earth metal-containing oxide layer in accordance with embodiments. The processing chamber 100 may be used for processes in which a corrosive plasma environment having plasma processing conditions is provided. For example, the processing chamber 100 may be a chamber for a plasma etcher or plasma etch reactor, a plasma cleaner, plasma enhanced CVD or ALD reactors and so forth. Examples of chamber components that may include the plasma resistant coating include chamber components with complex shapes and holes having high aspect ratios. Some exemplary chamber components include a substrate support assembly 148, an electrostatic chuck (ESC) 150, a ring (e.g., a process kit ring or single ring), a chamber wall, a base, a gas distribution plate, a showerhead of a processing chamber, gas lines, a nozzle, a lid, a liner, a liner kit, a shield, a plasma screen, a flow equalizer, a cooling base, a chamber viewport, a chamber lid, and so on. The plasma resistant coating, which is described in greater detail below, is applied by ALD. ALD allows for the application of a conformal coating of a substantially uniform thickness that is porosity-free on all types of components including components with complex shapes and features having high aspect ratios.

The plasma resistant coating may be grown or deposited using ALD with a precursor for the stress relief layer and one or more precursors for deposition of a rare earth metal-containing oxide or co-deposition of a rare earth metal-containing oxide in combination with one or more additional oxides to form a rare earth metal-containing oxide layer. In one embodiment, the rare earth metal-containing oxide layer has a polycrystalline structure. The rare earth metal-containing oxide may include yttrium, tantalum, zirconium and/or erbium. For example, the rare earth metal-containing oxide may be yttria ($Y_2O_3$), erbium oxide ($Er_2O_3$), zirconium oxide ($ZrO_2$), tantalum oxide ($Ta_2O_5$), and so on. In embodiments, the rare-earth metal-containing oxide is polycrystalline yttria. In other embodiments, the rare-earth metal-containing oxide is amorphous yttria. The rare earth metal-containing oxide may also include aluminum mixed with one or more rare earth elements such as yttrium, zirconium and/or erbium. The additional oxide (or oxides) that may be co-deposited with the rare earth metal-containing oxide to form the rare earth metal-containing oxide layer may include zirconium oxide ($ZrO_2$), aluminum oxide ($Al_2O_3$), erbium oxide ($Er_2O_3$), or a combination thereof. A yttrium-containing oxide layer for the multi-layer plasma resistant coating may be, for example, $Y_xZr_yO_z$, $Y_aZr_xAl_yO_z$, $Y_xAl_yO_z$, or $Y_xEr_yO_z$. The yttrium-containing oxide may be yttria ($Y_2O_3$) with yttriaite having a cubic structure with space group Ia-3 (206).

In one embodiment, the rare-earth metal-containing oxide layer is one of $Y_2O_3$, $Er_2O_3$, $Y_3Al_5O_{12}$ (YAG), $Er_3Al_5O_{12}$ (EAG), or $Y_4Al_2O_9$ (YAM). The rare-earth metal-containing oxide layer may also be $YAlO_3$ (YAP), $Er_4Al_2O_9$ (EAM), $ErAlO_3$ (EAP), a solid-solution of $Y_2O_3$—$ZrO_2$ and/or a ceramic compound comprising $Y_4Al_2O_9$ and a solid-solution of $Y_2O_3$—$ZrO_2$.

With reference to the solid-solution of $Y_2O_3$—$ZrO_2$, the rare-earth metal-containing oxide layer may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the rare-earth metal-containing oxide layer. In one embodiment, the alternative ceramic compound can include $Y_2O_3$ in a range of 40-45 mol %, $ZrO_2$ in a range of 0-10 mol %, Er2O3 in a range of 35-40 mol %, Gd2O3 in a range of 5-10 mol % and SiO2 in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned rare-earth metal-containing oxide layers may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The stress relief layer may include amorphous aluminum oxide or similar material and improves adhesion of the plasma resistant coating to the chamber component as well as thermal resistance to cracking and delamination of the plasma resistant coating at temperatures up to about 350° C. in embodiments or 200° C. or from about 200° C. to about 350° C.

As illustrated, the substrate support assembly 148 has a plasma resistant coating 136, in accordance with one embodiment. However, it should be understood that any of the other chamber components, such as chamber walls, showerheads, gas lines, electrostatic chucks, nozzles and others, may also be coated with the ceramic coating.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the plasma resistant coating.

An outer liner 116 may be disposed adjacent the sidewalls 108 to protect the chamber body 102. The outer liner 116 may be fabricated and/or coated with a bi-layer coating. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes a gas distribution plate (GDP) 133 having multiple gas delivery holes 132 throughout the GDP 133. The showerhead 130 may include the GDP 133 bonded to an aluminum base or an anodized aluminum base. The GDP 133 may be made from Si or SiC, or may be a ceramic such as $Y_2O_3$, $Al_2O_3$, $Y_3Al_5O_{12}$ (YAG), and so forth. Showerhead 130 and delivery holes 132 may be coated with a plasma resistant coating as described in more detail below with respect to FIGS. 4A and 4B.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead base 104, GDP 133 and/or nozzle may all be coated with a plasma resistant coating according to an embodiment.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The substrate support assembly 148 is disposed in the interior volume 106 of the processing chamber 100 below the showerhead 130 or lid. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may also be coated with a plasma resistant coating as described herein.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. An upper surface of the electrostatic puck 166 may be covered by the yttrium-based oxide plasma resistant coating 136 in the illustrated embodiment. The plasma resistant coating 136 may be disposed on the entire exposed surface of the electrostatic chuck 150 including the outer and side periphery of the thermally conductive base 164 and the electrostatic puck 166 as well as any other geometrically complex parts or holes having large aspect ratios in the electrostatic chuck. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164. The conduits and heater heat and/or cool the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the puck 166. These surface features may all be coated with a yttrium-based oxide plasma resistant coating according to an embodiment. The gas passages may be fluidly coupled to a source of a heat transfer (or backside) gas such as He via holes drilled in the electrostatic puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The clamping electrode 180 (or other electrode disposed in the electrostatic puck 166 or base 164) may further be coupled to one or more RF power sources 184, 186 through a matching circuit 188 for maintaining a plasma formed from process and/or other gases within the processing chamber 100. The RF power sources 184, 186 are generally capable of producing RF signal having a frequency from about 50 kHz to about 3 GHz and a power of up to about 10,000 Watts.

Figure 2A:
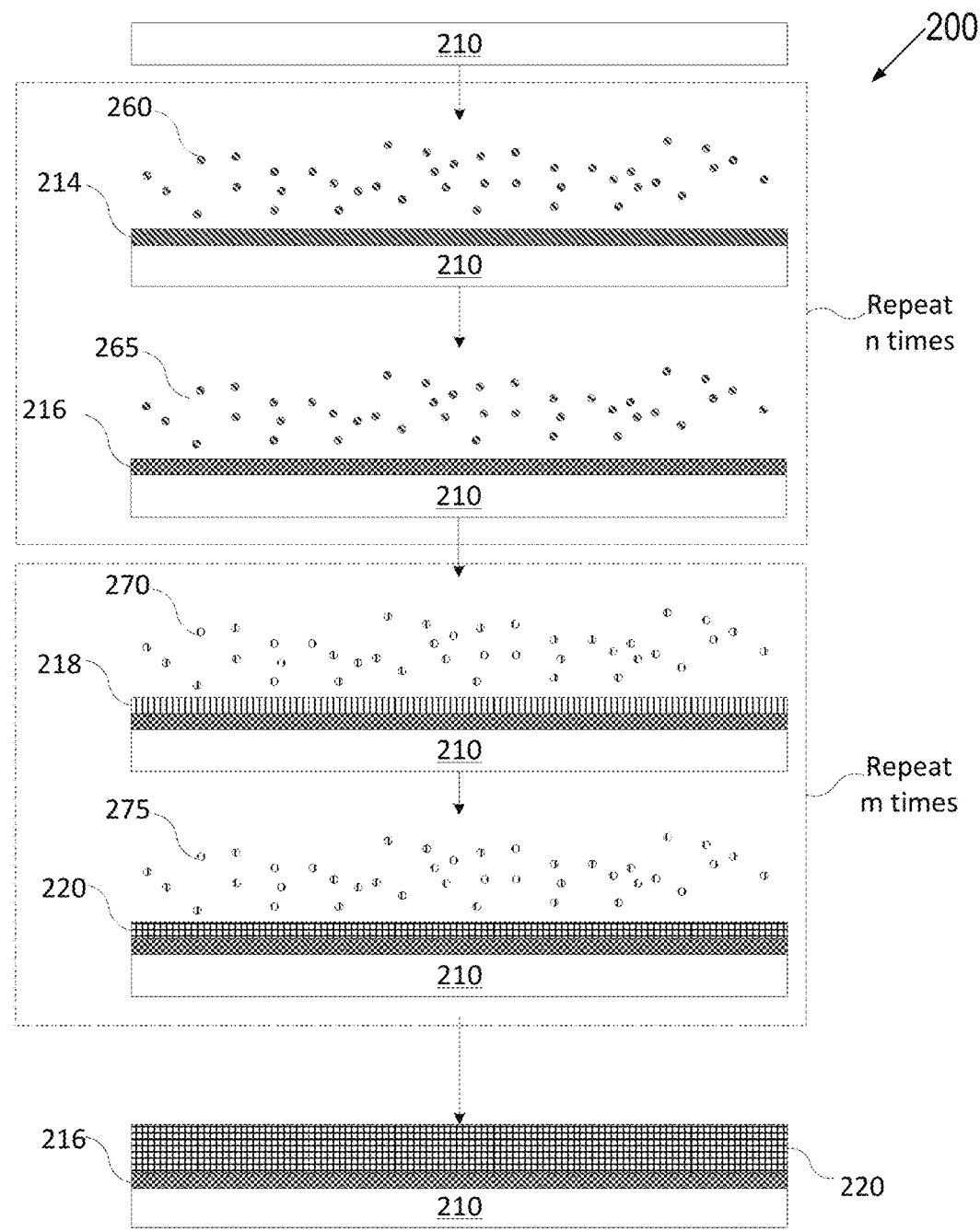
FIG. 2A depicts one embodiment of a deposition process in accordance with an atomic layer deposition technique as described herein.
Figure 2B:
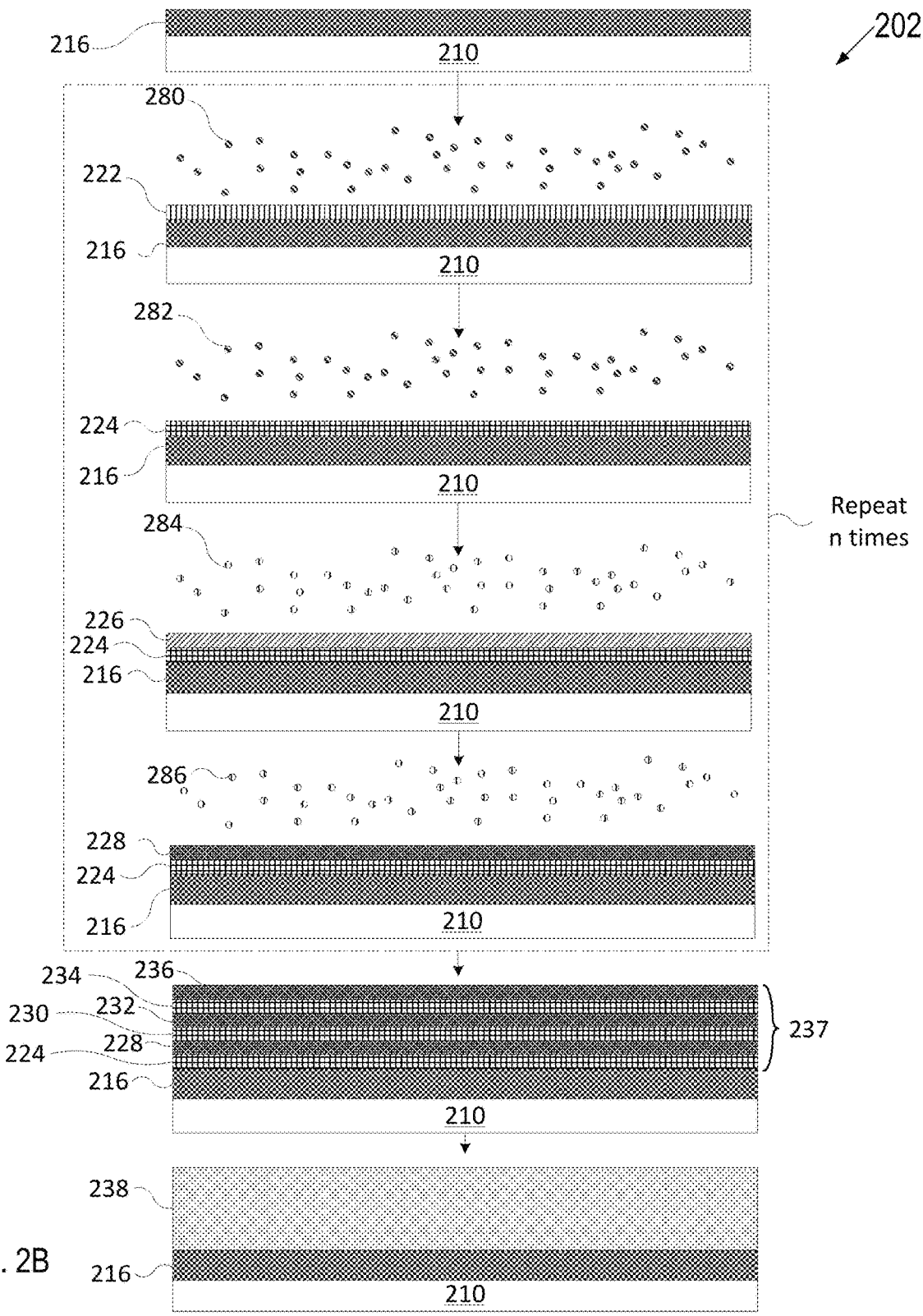
FIG. 2B depicts another embodiment of a deposition process in accordance with an atomic layer deposition technique as described herein.
Figure 2C:
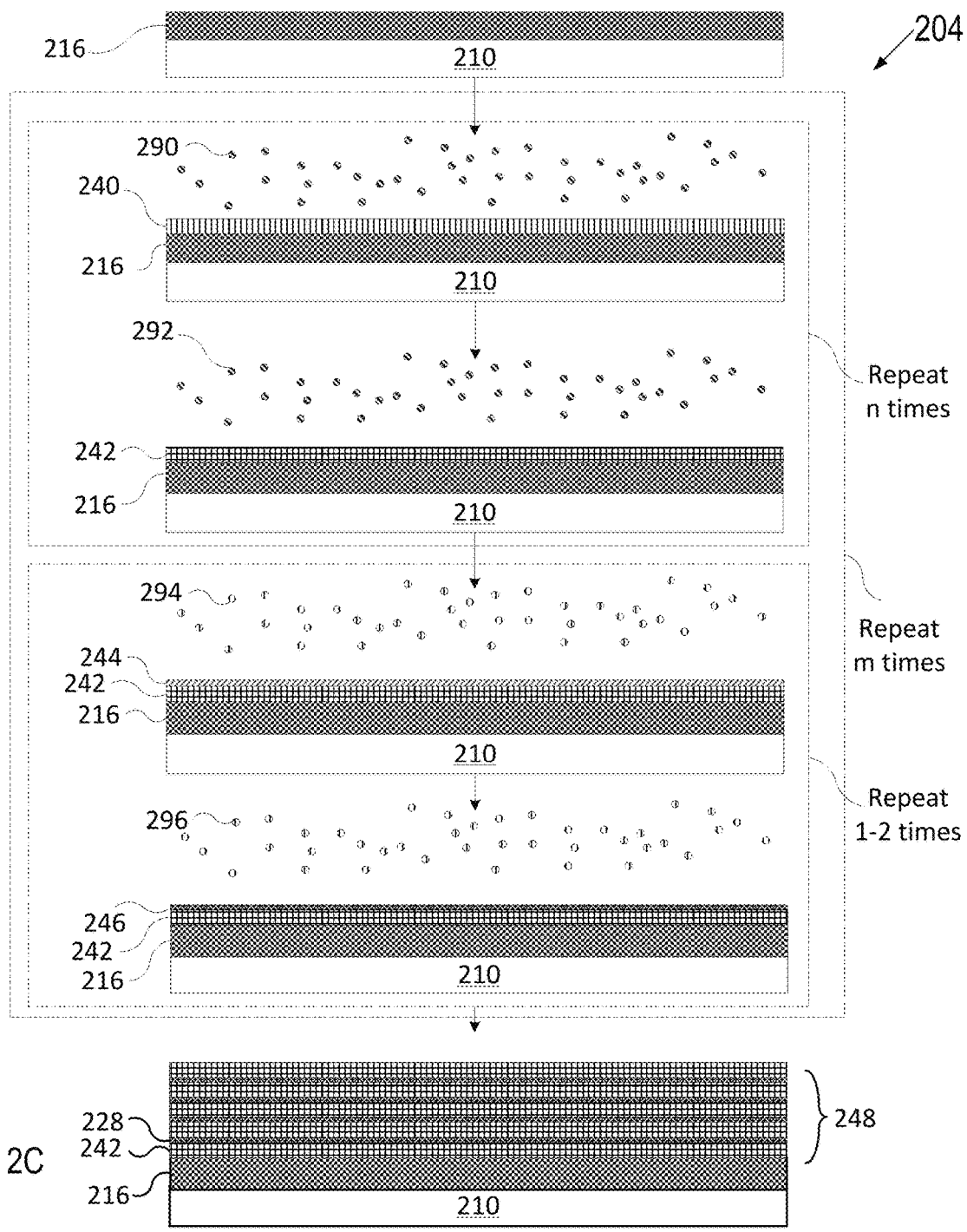
FIG. 2C depicts another embodiment of a deposition process in accordance with an atomic layer deposition technique as described herein.

FIG. 2A depicts one embodiment of a deposition process in accordance with an ALD technique to grow or deposit a plasma resistant coating on an article. FIG. 2B depicts another embodiment of a deposition process in accordance with an atomic layer deposition technique as described herein. FIG. 2C depicts another embodiment of a deposition process in accordance with an atomic layer deposition technique as described herein.

Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

FIGS. 2A-2C illustrate an article 210 having a surface. Article 210 may represent various process chamber components (e.g., semiconductor process chamber components) including but not limited to a substrate support assembly, an electrostatic chuck (ESC), a ring (e.g., a process kit ring or single ring), a chamber wall, a base, a gas distribution plate, gas lines, a showerhead, plasma electrodes, a plasma housing, a nozzle, a lid, a liner, a liner kit, a shield, a plasma screen, a flow equalizer, a cooling base, a chamber viewport, a chamber lid, a diffuser, and so on. The article 210 may be made from a metal (such as aluminum, stainless steel), a ceramic, a metal-ceramic composite, a polymer, a polymer ceramic composite, mylar, polyester, or other suitable materials, and may further comprise materials such as AlN, Si, SiC, $Al_2O_3$, $SiO_2$, and so on.

For ALD, either adsorption of a precursor onto a surface or a reaction of a reactant with the adsorbed precursor may be referred to as a "half-reaction." During a first half reaction, a precursor is pulsed onto the surface of the article 210 (or onto a layer formed on the article 210) for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

In some implementations, two or more precursors are injected together and adsorbed onto the surface of an article. The excess precursors are pumped out until an oxygen-containing reactant is injected to react with the adsorbates to form a solid single phase or multi-phase layer (e.g., of YAG, a phase of $Y_2O_3$—$ZrO_2$, and so on). This fresh layer is ready to adsorb the precursors in the next cycle.

In FIG. 2A, article 210 may be introduced to a first precursor 260 for a first duration until a surface of article 210 is fully adsorbed with the first precursor 260 to form an adsorption layer 214. Subsequently, article 210 may be introduced to a first reactant 265 to react with the adsorption layer 214 to grow a solid stress relief layer 216 (e.g., so that the stress relief layer 216 is fully grown or deposited, where the terms grown and deposited may be used interchangeably herein). The first precursor 260 may be a precursor for aluminum or another metal, for example. The first reactant 265 may be oxygen, water vapor, ozone, pure oxygen, oxygen radicals, or another oxygen source if the stress relief layer 216 is an oxide. Accordingly, ALD may be used to form the stress relief layer 216.

In an example where the stress relief layer 216 is an alumina ($Al_2O_3$) stress relief layer, article 210 (e.g., an Al6061 substrate) may be introduced to a first precursor 260 (e.g., trimethyl aluminum (TMA)) for a first duration until all the reactive sites on the surface are consumed. The remaining first precursor 260 is flushed away and then a first reactant 265 of $H_2O$ is injected into the reactor to start the second half cycle. A stress relief layer 216 of $Al_2O_3$ is formed after $H_2O$ molecules react with the Al containing adsorption layer created by the first half reaction.

Stress relief layer 216 may be uniform, continuous and conformal. The stress relief layer 216 may be porosity free (e.g., have a porosity of 0) or have an approximately 0 porosity in embodiments (e.g., a porosity of 0% to 0.01%). Layer 216 may have a thickness of less than one atomic layer to a few atoms in some embodiments after a single ALD deposition cycle. Some metalorganic precursor molecules are large. After reacting with the reactant 265, large organic ligands may be gone, leaving much smaller metal atoms. One full ALD cycle (e.g., that includes introduction of precursors 260 followed by introduction of reactants 265) may result in less than a single atomic layer. For example, an $Al_2O_3$ monolayer grown by TMA and $H_2O$ typically has a growth rate of about 0.9-1.3 A/cycle while the $Al_2O_3$ lattice constant is a–4.7 A and c=13 A (for a trigonal structure).

Multiple full ALD deposition cycles may be implemented to deposit a thicker stress relief layer 216, with each full cycle (e.g., including introducing precursor 260, flushing, introducing reactant 265, and again flushing) adding to the thickness by an additional fraction of an atom to a few atoms. As shown, up to n full cycles may be performed to grow the stress relief layer 216, where n is an integer value greater than 1. In embodiments, stress relief layer 216 may have a thickness of about 10 nm to about 1.5 μm. Stress relief layer 216 may have a thickness of about 10 nm to about 15 nm in embodiments or about 0.8-1.2 μm in other embodiments.

The stress relief layer 216 provides robust mechanical properties. Stress relief layer 216 may enhance dielectric strength, may provide better adhesion of the plasma resistant coating to the component (e.g., formed of Al6061, Al6063 or ceramic), and may prevent cracking of the plasma resistant coating at temperatures up to about 200° C., or up to about 250° C., or from about 200° C. to about 250° C. In further embodiments, the stress relief layer 216 may prevent cracking of the plasma resistant coating at temperatures of up to about 350° C. Such metal articles have a coefficient of thermal expansion that may be significantly higher than the coefficient of thermal expansion of a rare-earth metal-containing oxide layer of the plasma resistant coating. By first applying the stress relief layer 216, the detrimental effect of mismatch in coefficients of thermal expansion between the article and the rare-earth metal-containing oxide layer may be managed. Since ALD is used for the deposition, the internal surfaces of high aspect ratio features such as gas delivery holes in a showerhead or a gas delivery line may be coated, and thus an entirety of a component may be protected from exposure to a corrosive environment.

Layer 216 may be $Al_2O_3$, such as amorphous $Al_2O_3$, in embodiments. Amorphous $Al_2O_3$ has a higher temperature capability than, for example, a yttrium-containing oxide. Therefore, the addition of an amorphous $Al_2O_3$ layer as a stress relief layer under a yttrium-containing oxide layer or other rare-earth metal-containing oxide layer may increase the thermal resistance of the plasma resistant coating as a whole by relieving the elevated stress concentrated at some areas of the yttria/Al6061 interface. Moreover, $Al_2O_3$ has good adhesion to an aluminum based component because of common elements (i.e., the aluminum). Similarly, $Al_2O_3$ has good adhesion to rare earth metal-containing oxides also because of common elements (i.e., the oxides). These improved interfaces reduce interfacial defects which are prone to initiate cracks.

Additionally, the amorphous $Al_2O_3$ layer may act as a barrier that prevents migration of metal contaminants (e.g., Mg, Cu, etc. trace metals) from the component or article into the rare earth metal-containing oxide layer. For example, testing was performed in which a copper source layer was deposited over the $Al_2O_3$ stress relief layer 216. A secondary ion mass spectroscopy (SIMS) depth profile shows that no copper diffused into the $Al_2O_3$ stress relief layer 216 or through the $Al_2O_3$ stress relief layer 216 after annealing at 300 C for 4 hours.

Subsequently, article 210 having layer 216 may be introduced to an additional one or more precursors 270 for a second duration until a surface of stress relief layer 216 is fully adsorbed with the one or more additional precursors 270 to form an adsorption layer 218. Subsequently, article 210 may be introduced to a reactant 275 to react with adsorption layer 218 to grow a solid rare-earth metal-containing oxide layer 220, also referred to as the second layer 220 for simplicity (e.g., so that the second layer 220 is fully grown or deposited). Accordingly, the second layer 220 is fully grown or deposited over stress relief layer 216 using ALD. In an example, precursor 270 may be a yttrium containing precursor used in the first half cycle, and reactant 275 may be $H_2O$ used in the second half cycle.

The second layer 220 forms the yttrium-containing oxide layer or other rare-earth metal-containing oxide layer, which may be uniform, continuous and conformal. The second layer 220 may have a very low porosity of less than 1% in embodiments, and less than 0.1% in further embodiments, and about 0% in embodiments or porosity-free in still further embodiments. Second layer 220 may have a thickness of less than an atom to a few atoms (e.g., 2-3 atoms) after a single full ALD deposition cycle. Multiple ALD deposition stages may be implemented to deposit a thicker second layer 220, with each stage adding to the thickness by an additional fraction of an atom to a few atoms. As shown, the full deposition cycle may be repeated m times to cause the second layer 220 to have a desired thickness, where m is an integer value greater than 1. In embodiments, second layer 220 may have a thickness of about 10 nm to about 1.5 µm. Second layer 220 may have a thickness of about 10 nm to about 20 nm in embodiments or about 50 nm to about 60 nm in some embodiments. In other embodiments, second layer 220 may have a thickness of about 90 nm to about 110 nm.

A ratio of the rare earth metal-containing oxide layer thickness to the stress relief layer thickness may be 200:1 to 1:200. A higher ratio of the rare earth metal-containing oxide layer thickness to the stress relief layer thickness (e.g., 200:1, 100:1, 50:1, 20:1, 10:1, 5:1, 2:1 etc.) provides better corrosion and erosion resistance, while a lower ratio of the rare earth metal-containing oxide layer thickness to the stress relief layer thickness (e.g., 1:2, 1:5, 1:10, 1:20, 1:50, 1:100, 1:200) provides better heat resistance (e.g., improved resistance to cracking and/or delamination caused by thermal cycling). The thickness ratio may be selected in accordance with specific chamber applications. In an example, for a capacitive coupled plasma environment with high sputter rate, a top layer of 1 um may be deposited on a 50 nm stress relief $Al_2O_3$ layer. For a high temperature chemical or radical environment without energetic ion bombardment, a top layer of 100 nm with a bottom layer of 500 nm may be optimal. A thick bottom layer can also prevent trace metals from diffusing out from the underlying substrate or article that the plasma resistant coating is on.

Second layer 220 may be any of the aforementioned rare-earth metal-containing oxide layers. For example, second layer 220 may be $Y_2O_3$, alone or in combination with one or more other rare earth metal oxides. In some embodiments, second layer 220 is a single phase material formed from a mixture of at least two rare earth metal-containing oxide precursors that have been co-deposited by ALD (e.g., combinations of one or more of $Y_2O_3$, $Er_2O_3$, $Al_2O_3$ and $ZrO_2$). For example, second layer 220 may be one of $Y_xZr_yO_z$, $Y_xEr_yO_z$, $Y_3Al_5O_{12}$ (YAG), $Y_4Al_2O_9$ (YAM), $Y_2O_3$ stabilized $ZrO_2$ (YSZ), or a ceramic compound comprising $Y_4Al_2O_9$ and a solid-solution of $Y_2O_3$—$ZrO_2$. In one embodiment, the stress relief layer 216 is amorphous $Al_2O_3$ and the second layer 220 is a polycrystalline or amorphous yttrium-containing oxide compound (e.g., $Y_2O_3$, $Y_xAl_yO_z$, $Y_xZr_yO_z$, $Y_xEr_yO_z$) alone or in a single phase with one or more other rare earth metal-containing oxide material. Accordingly, stress relief layer 216 may be a stress relief layer that is deposited prior to deposition of the yttrium-containing oxide layer.

In some embodiments, second layer 220 may include $Er_2O_3$, $Y_2O_3$, $Al_2O_3$, or $ZrO_2$. In some embodiments, second layer 220 is a multi-component material of at least one of $Er_xAl_yO_z$ (e.g., $Er_3Al_5O_{12}$), $Er_xZr_yO_z$, $Er_aZr_xAl_yO_z$, $Y_xEr_yO_z$, or $Er_aY_xZr_yO_z$ (e.g., a single phase solid solution of $Y_2O_3$, $ZrO_2$ and $Er_2O_3$). Second layer 220 may also be one of $Y_3Al_5O_{12}$ (YAG), $Y_4Al_2O_9$ (YAM), $Y_2O_3$ stabilized $ZrO_2$ (YSZ), or a ceramic compound comprising $Y_4Al_2O_9$ and a solid-solution of $Y_2O_3$—$ZrO_2$. In one embodiment, the second layer 220 is an erbium containing compound (e.g., $Er_2O_3$, $Er_xAl_yO_z$, $Er_xZr_yO_z$, $Er_aZr_xAl_yO_z$, $Y_xEr_yO_z$, or $Er_aY_xZr_yO_z$).

With reference to FIGS. 2B-2C, in some embodiments, the plasma resistant coating contains more than two layers. Specifically, the plasma resistant coating may include a sequence of alternating layers of the stress relief layer and the rare-earth metal-containing oxide layer, or may include the stress relief layer and a sequence of alternating layers for the rare-earth metal-containing oxide layer. In some embodiments, a rare-earth metal-containing oxide layer is a layer of alternating sub-layers. For example, a rare-earth metal-containing oxide layer may be a series of alternating sublayers of $Y_2O_3$ and $Al_2O_3$, a series of alternating sublayers of $Y_2O_3$ and $ZrO_2$, a series of alternating sublayers of $Y_2O_3$, $Al_2O_3$ and $ZrO_2$, and so on.

Referring to FIG. 2B, an article 210 having a stress relief layer 216 may be inserted into a deposition chamber. The stress relief layer 216 may have been formed as set forth with reference to FIG. 2A. Article 210 having stress relief layer 216 may be introduced to one or more precursors 280 for a duration until a surface of stress relief layer 216 is fully adsorbed with the one or more additional precursors 280 to form an adsorption layer 222. Subsequently, article 210 may be introduced to a reactant 282 to react with adsorption layer 222 to grow a solid metal oxide layer 224. Accordingly, the metal oxide layer 224 is fully grown or deposited over stress relief layer 216 using ALD. In an example, precursor 280 may be a yttrium containing precursor used in the first half cycle, and reactant 282 may be $H_2O$ used in the second half cycle. The metal oxide layer 224 may be a first one of $Y_2O_3$, $ZrO_2$, $Al_2O_3$, $Er_2O_3$, $Ta_2O_5$, or another oxide.

Article 210 having stress relief layer 216 and metal oxide layer 224 may be introduced to one or more precursors 284 for a duration until a surface of metal oxide layer 224 is fully adsorbed with the one or more precursors 284 to form an adsorption layer 226. Subsequently, article 210 may be introduced to a reactant 286 to react with adsorption layer 226 to grow an additional solid metal oxide layer 228. Accordingly, the additional metal oxide layer 228 is fully grown or deposited over the metal oxide layer 224 using ALD. In an example, precursor 284 may be a zirconium containing precursor used in the first half cycle, and reactant 286 may be $H_2O$ used in the second half cycle. The metal oxide layer 224 may be a second one of $Y_2O_3$, $ZrO_2$, $Al_2O_3$, $Er_2O_3$, $Ta_2O_5$, or another oxide.

As shown, the deposition of the metal oxide 224 and the second metal oxide 228 may be repeated n times to form a stack 237 of alternating layers, where n is an integer value greater than 2. N may represent a finite number of layers selected based on the targeted thickness and properties. The stack 237 of alternating layers may be considered as a rare-earth metal-containing oxide layer containing multiple alternating sub-layers. Accordingly, precursors 280, reactants 284, precursors 284 and reactants 286 may be repeatedly introduced sequentially to grow or deposit additional alternating layers 230, 232, 234, 236, and so on. Each of the layers 224, 224, 230, 232, 234, 236, and so on may be very thin layers having a thickness of less than a single atomic layer to a few atomic layers. For example, an $Al_2O_3$ monolayer grown by TMA and $H_2O$ typically has a growth rate of about 0.9-1.3 A/cycle while the $Al_2O_3$ lattice constant is a–4.7 A and c=13 A (for a trigonal structure).

The alternating layers 224-236 described above have a 1:1 ratio, where there is a single layer of a first metal oxide for each single layer of a second metal oxide. However, in other embodiments there may be other ratios such as 2:1, 3:1, 4:1, and so on between the different types of metal oxide layers. For example, two $Y_2O_3$ layers may be deposited for every $ZrO_2$ layer in an embodiment. Additionally, the stack 237 of alternating layers 224-236 have been described as an alternating series of two types of metal oxide layers. However, in other embodiments more than two types of metal oxide layers may be deposited in an alternating stack 237. For example, the stack 237 may include three different alternating layers (e.g., a first layer of $Y_2O_3$, a first layer of $Al_2O_3$, a first layer of $ZrO_2$, a second layer of $Y_2O_3$, a second layer of $Al_2O_3$, a second layer of $ZrO_2$, and so on).

After the stack 237 of alternating layers has been formed, an anneal process may be performed to cause the alternating layers of different materials to diffuse into one another and form a complex oxide having a single phase or multiple phases. After the annealing process, the stack of alternating layers 237 may therefore become a single rare-earth metal-containing oxide layer 238. For example, if the layers in the stack are $Y_2O_3$, $Al_2O_3$, and $ZrO_2$, then the resulting rare-earth metal-containing oxide layer 238 may a ceramic compound comprising $Y_4Al_2O_9$ and a solid-solution of $Y_2O_3$—$ZrO_2$. If the layers in the stack are $Y_2O_3$ and $ZrO_2$, then be a solid-solution of $Y_2O_3$—$ZrO_2$ may be formed.

Referring to FIG. 2C, an article 210 having a stress relief layer 216 may be inserted into a deposition chamber. The stress relief layer 216 may have been formed as set forth with reference to FIG. 2A. Article 210 having stress relief layer 216 may be introduced to one or more precursors 290 for a duration until a surface of stress relief layer 216 is fully adsorbed with the one or more precursors 290 to form an adsorption layer 240. Subsequently, article 210 may be introduced to a reactant 292 to react with adsorption layer 240 to grow a solid rare earth oxide layer 242. The precursors 290 and reactant 292 may correspond to precursors 270 and reactant 275 in embodiments. Accordingly, the rare earth oxide layer 242 is fully grown or deposited over stress relief layer 216 using ALD. The process of introducing the precursors 290 and then the reactant 292 may be repeated n times to cause the rare earth oxide layer 242 to have a desired thickness, where n is an integer greater than 1.

Article 210 having stress relief layer 216 and rare earth oxide layer 242 may be introduced to one or more precursors 294 for a duration until a surface of rare earth oxide layer 242 is fully adsorbed with the one or more precursors 294 to form an adsorption layer 244. Subsequently, article 210 may be introduced to a reactant 296 to react with adsorption layer 244 to grow a barrier layer 246. The precursors 294 and reactants 296 may correspond to precursors 260 and reactants 265 in embodiments. Accordingly, the barrier layer 244 may have a same material composition as the stress relief layer 216. The barrier layer 246 is fully grown or deposited over the rare earth oxide layer 242 using ALD. The process of introducing the precursors 294 and then the reactant 296 may be performed one or two times to form a thin barrier layer 246 that may prevent crystal growth in the rare earth oxide layers.

As shown, the deposition of the rare earth oxide 242 and the barrier layer 228 may be repeated m times to form a stack 248 of alternating layers, where m is an integer value greater than 1. N may represent a finite number of layers selected based on the targeted thickness and properties. The stack 248 of alternating layers may be considered as a rare-earth metal-containing oxide layer containing multiple alternating sub-layers.

The final structure shown in FIG. 2C is a cross sectional side view of an article 210 coated with a plasma resistant coating that comprises an amorphous stress relief layer 216 and a stack 248 of alternating layers of a rare earth metal-containing oxide 242 and a second oxide or other ceramic 228. The amorphous stress relief layer 216 may have a thickness of about 10 nm to about 1.5 µm. In embodiments, the stress relief layer may have a thickness of about 10-100 nm. In further embodiments, the stress relief layer 216 may have a thickness of about 20-50 nm. In still further embodiments, the stress relief layer 216 may have a thickness of about 20-30 nm.

The second oxide or other ceramic may be a same oxide as an oxide used to form the stress relief layer (e.g., $Al_2O_3$) in some embodiments. Alternatively, the second oxide or ceramic may be a different oxide than the oxide used to form the stress relief layer.

Each layer of the rare earth metal-containing oxide may have a thickness of about 5-10 angstroms and may be formed by performing about 5-10 cycles of an ALD process, where each cycle forms a nanolayer (or slightly less or more than a nanolayer) of the rare earth metal-containing oxide. In one embodiment, each layer of the rare-earth metal-containing oxide is formed using about 6-8 ALD cycles. Each layer of the second oxide or other ceramic may be formed from a single ALD cycle (or a few ALD cycles) and may have a thickness of less than an atom to a few atoms. Layers of the rare earth metal-containing oxide may each have a thickness of about 5-100 angstroms, and layers of the second oxide may each have a thickness of about 1-20 angstroms in embodiments, and a thickness of 1-4 angstroms in further embodiments. The stack 248 of alternating layers of the rare earth metal-containing oxide 242 and the second oxide or other ceramic 228 may have a total thickness of about 10 nm to about 1.5 μm. In further embodiments, the stack 248 may have a thickness of about 100 nm to about 1.5 μm. In further embodiments, the stack 248 may have a thickness of about 100 nm to about 300 nm, or about 100-150 nm. The thin layers of the second oxide or other ceramic 246 between the layers 242 of the rare earth metal-containing oxide may prevent crystal formation in the rare earth metal-containing oxide layers. This may enable an amorphous yttria layer to be grown.

Figure 9:
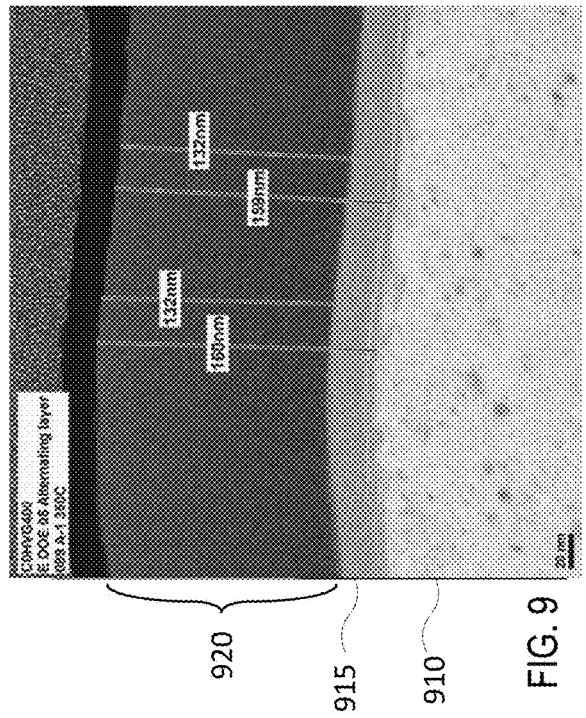
FIG. 9 illustrates a cross sectional side view TEM image of a plasma resistant ceramic coating structure on Al 6061 substrate as described with regards to FIG. 2C.
Figure 10:
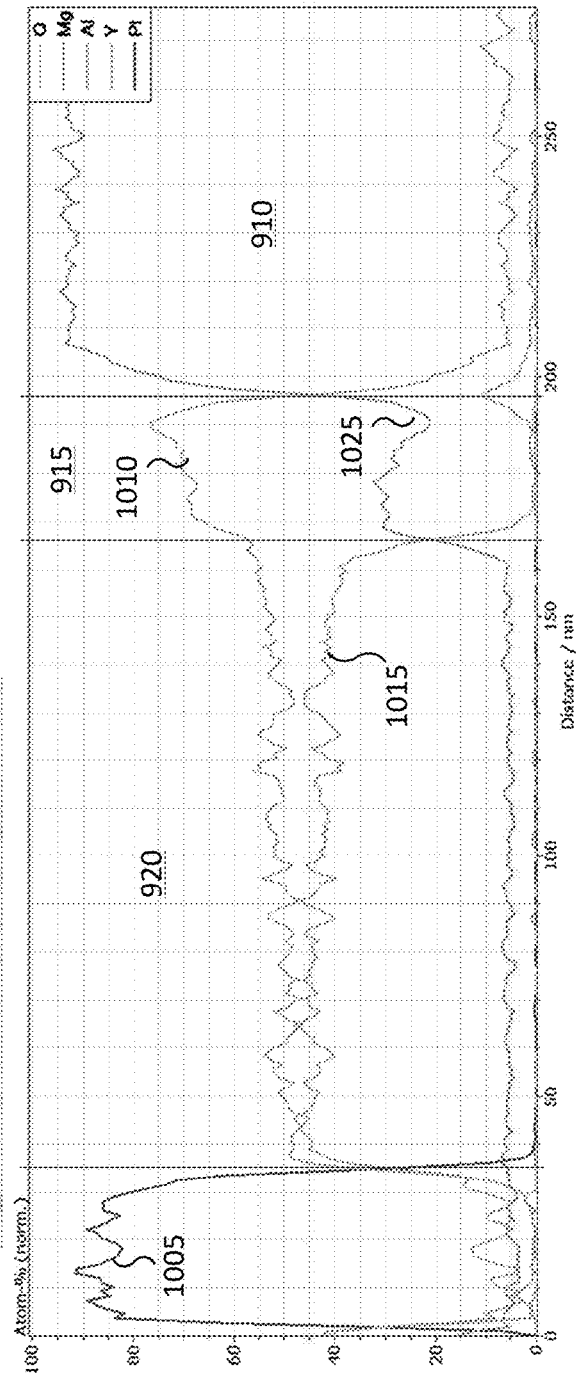
FIG. 10 is a scanning transmission electron microscopy energy-dispersive x-ray spectroscopy (STEM-EDS) line scan of the plasma resistant ceramic sample shown in FIG. 9.

FIGS. 9-10 illustrate measurement data for an manufactured in accordance with the technique described in FIG. 2C.

In the embodiments described with reference to FIGS. 2A-2C, the surface reactions (e.g., half-reactions) are done sequentially, and the various precursors and reactants are not in contact in embodiments. Prior to introduction of a new precursor or reactant, the chamber in which the ALD process takes place may be purged with an inert carrier gas (such as nitrogen or air) to remove any unreacted precursor and/or surface-precursor reaction byproducts. The precursors will be different for each layer and the second precursor for the yttrium-containing oxide layer or other rare-earth metal-containing oxide layer may be a mixture of two rare earth metal-containing oxide precursors to facilitate co-deposition of these compounds to form a single phase material layer. In some embodiments, at least two precursors are used, in other embodiments at least three precursors are used and in yet further embodiments at least four precursors are used.

ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 100° C. to about 400° C. In some embodiments, the ALD temperature window is between about 120-300° C.

The ALD process allows for a conformal plasma resistant coating having uniform thickness on articles and surfaces having complex geometric shapes, holes with high aspect ratios, and three-dimensional structures. Sufficient exposure time of each precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets). In some embodiments ALD is used to coat articles aspect ratios of about 10:1 to about 300:1.

With the ALD techniques described herein, multi-component films such as $Y_xAl_yO_z$ (e.g., $Y_3Al_5O_{12}$), $Y_xZr_yO_z$, and $Y_aZr_xAl_yO_z$, $Y_xEr_yO_z$, $Y_xEr_yF_z$, or $Y_wEr_xO_yF_z$ can be grown, deposited or co-deposited, for example, by proper mixtures of the precursors used to grow the rare-earth metal-containing oxides alone or in combination with one or more other oxides as described above and in more detail in the examples below.

Figure 3A:
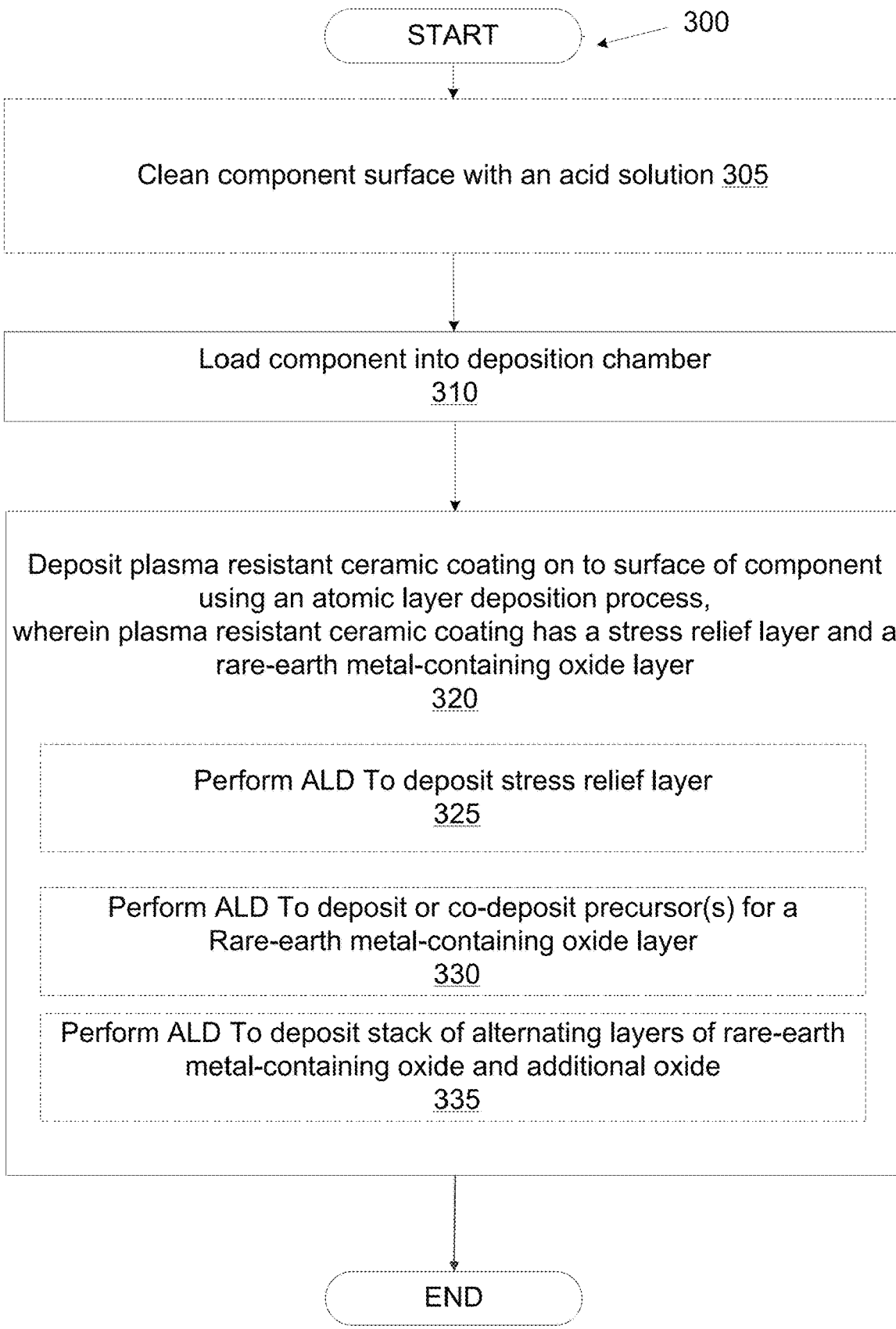
FIG. 3A illustrates a method for creating a plasma resistant coating using atomic layer deposition as described herein.

FIG. 3A illustrates a method 300 for forming a plasma resistant coating comprising a stress relief layer and a rare-earth metal-containing oxide layer on an article such as a process chamber component according to embodiments. Method 300 may be used to coat any articles including articles having aspect ratios of about 3:1 to about 300:1 (e.g., aspect ratios of 20:1, 50:1, 100:1, 150:1, and so on). The method may optionally begin by selecting a composition for the stress relief layer and for the yttrium-containing oxide layer of the plasma resistant coating. The composition selection and method of forming may be performed by the same entity or by multiple entities.

The method may optionally include, at block 305, cleaning the article with an acid solution. In one embodiment, the article is bathed in a bath of the acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution may improve a quality of a coating deposited using ALD. In one embodiment, an acid solution containing approximately 0.1-5.0 vol % HF is used to clean chamber components made of quartz. In one embodiment, an acid solution containing approximately 0.1-20 vol % HCl is used to clean articles made of $Al_2O_3$. In one embodiment, an acid solution containing approximately 5-15 vol % $HNO_3$ is used to clean articles made of aluminum and other metals.

At block 310, the article is loaded into an ALD deposition chamber. At block 320, the method comprises depositing a plasma resistant coating onto a surface of the article using ALD. In one embodiment, at block 325 ALD is performed to deposit a stress relief layer. In one embodiment, at block 330 ALD is performed to deposit or co-deposit a rare-earth metal-containing oxide layer alone or together with one or more other oxides. ALD is a very conformal process as performed in embodiments, which may cause the surface roughness of the plasma resistant coating to match a surface roughness of an underlying surface of the article that is coated. The plasma resistant coating may have a total thickness of about 20 nm to about 10 μm in some embodiments. In other embodiments, the plasma resistant coating may have a thickness of about 100 nm to about 2 micron. The plasma resistant coating may have a porosity of about 0% in embodiments, or may be porosity-free in embodiments, and may have a thickness variation of about +/−5% or less, +/−10% or less, or +/−20% or less.

In one embodiment, at block 335 ALD is performed to deposit a stack of alternating layers of the rare-earth metal containing oxide and an additional oxide. The additional oxide may be the same as or different from an oxide used for the stress relief layer.

A yttrium-containing oxide layer includes a yttrium-containing oxide and may include one or more additional rare earth metal oxides. Rare earth metal-containing oxide materials that include yttrium may be used to form the plasma resistant coating in embodiments because yttrium-containing oxides generally have high stability, high hardness, and superior erosion resistant properties. For example, $Y_2O_3$ is one of the most stable oxides and has a standard Gibbs free energy of formation)($\Delta G_f^o$ of −1816.65 kJ/mol, indicating the reactions of $Y_2O_3$ with most of the process chemicals are thermodynamically unfavorable under standard conditions. Plasma resistant coatings that include the stress relief layer and rare-earth metal-containing oxide layer with $Y_2O_3$ deposited in accordance with embodiments herein may also have a low erosion rate to many plasma and chemistry environments, such as an erosion rate of about 0 μm/hr when exposed to a direct $NF_3$ plasma chemistry at a bias of 200 Watts and 500° C. For example, a 1 hour test of direct $NF_3$ plasma at 200 Watts and 500° C. caused no measureable erosion. The plasma resistant coatings deposited in accordance with embodiments herein may also be resistant to cracking and delamination at temperatures up to about 250° C. in embodiments, or up to about 200° C. in embodiments, or from about 200° C. to about 250° C. in further embodiments. In contrast, coatings formed using conventional plasma spray coating or ion assisted deposition form cracks upon deposition and at temperatures at or below 200° C.

Examples of yttrium-containing oxide compounds that the plasma resistant coating may be formed of include $Y_2O_3$, $Y_xAl_yO_z$ (e.g., $Y_3Al_5O_{12}$), $Y_xZr_yO_z$, $Y_aZr_xAl_yO_z$, or $Y_xEr_yO_z$. The yttrium content in the plasma resistant coating may range from about 0.1 at. % to close to 100 at. %. For yttrium-containing oxides, the yttrium content may range from about 0.1 at. % to close to 100 at. % and the oxygen content may range from about 0.1 at. % to close to 100 at. %.

Examples of erbium-containing oxide compounds that the plasma resistant coating may be formed of include $Er_2O_3$, $Er_xAl_yO_z$ (e.g., $Er_3Al_5O_{12}$), $Er_xZr_yO_z$, $Er_aZr_xAl_yO_z$, $Y_xEr_yO_z$, and $Er_aY_xZr_yO_z$ (e.g., a single phase solid solution of $Y_2O_3$, $ZrO_2$ and $Er_2O_3$). The erbium content in the plasma resistant coating may range from about 0.1 at. % to close to 100 at. %. For erbium-containing oxides, the erbium content may range from about 0.1 at. % to close to 100 at. % and the oxygen content may range from about 0.1 at. % to close to 100 at. %.

Advantageously, $Y_2O_3$ and $Er_2O_3$ are miscible. A single phase solid solution can be formed for any combination of $Y_2O_3$ and $Er_2O_3$. For example, a mixture of just over 0 mol % $Er_2O_3$ and just under 100 mol % $Y_2O_3$ may be combined and co-deposited to form a plasma resistant coating that is a single phase solid solution. Additionally, a mixture of just over 0 mol % $E_2O_3$ and just under 100 mol % $Y_2O_3$ may be combined to form a plasma resistant coating that is a single phase solid solution. Plasma resistant coatings of $Y_xEr_yO_z$ may contain between over 0 mol % to under 100 mol % $Y_2O_3$ and over 0 mol % to under 100 mol % $Er_2O_3$. Some notable examples include 90-99 mol % $Y_2O_3$ and 1-10 mol % $Er_2O_3$, 80-89 mol % $Y_2O_3$ and 11-20 mol % $Er_2O_3$, 70-79 mol % $Y_2O_3$ and 21-30 mol % $Er_2O_3$, 60-69 mol % $Y_2O_3$ and 31-40 mol % $Er_2O_3$, 50-59 mol % $Y_2O_3$ and 41-50 mol % $Er_2O_3$, 40-49 mol % $Y_2O_3$ and 51-60 mol % $Er_2O_3$, 30-39 mol % $Y_2O_3$ and 61-70 mol % $Er_2O_3$, 20-29 mol % $Y_2O_3$ and 71-80 mol % $Er_2O_3$, 10-19 mol % $Y_2O_3$ and 81-90 mol % $Er_2O_3$, and 1-10 mol % $Y_2O_3$ and 90-99 mol % $Er_2O_3$. The single phase solid solution of $Y_xEr_yO_z$ may have a monoclinic cubic state at temperatures below about 2330° C.

Advantageously, $ZrO_2$ may be combined with $Y_2O_3$ and $Er_2O_3$ to form a single phase solid solution containing a mixture of the $ZrO_2$, $Y_2O_3$ and $Er_2O_3$ (e.g., $Er_aY_xZr_yO_z$). The solid solution of $Y_aEr_xZr_yO_z$ may have a cubic, hexagonal, tetragonal and/or cubic fluorite structure. The solid solution of $Y_aEr_xZr_yO_z$ may contain over 0 mol % to 60 mol % $ZrO_2$, over 0 mol % to 99 mol % $Er_2O_3$, and over 0 mol % to 99 mol % $Y_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Er_2O_3$ and/or $Y_2O_3$ that may be used include 10 mol %, 20 mol %, 30 mol %, 40 mol %, 50 mol %, 60 mol %, 70 mol %, 80 mol %, and 90 mol %.

Plasma resistant coatings of $Y_aZr_xAl_yO_z$ may contain over 0% to 60 mol % $ZrO_2$, over 0 mol % to 99 mol % $Y_2O_3$, and over 0 mol % to 60 mol % $Al_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Y_2O_3$ that may be used include 10 mol %, 20 mol %, 30 mol %, 40 mol %, 50 mol %, 60 mol %, 70 mol %, 80 mol %, and 90 mol %. Some notable amounts of $Al_2O_3$ that may be used include 2 mol %, 5 mol %, 10 mol %, 20 mol %, 30 mol %, 40 mol %, 50 mol % and 60 mol %. In one example, the plasma resistant coating of $Y_aZr_xAl_yO_z$ contains 42 mol % $Y_2O_3$, 40 mol % $ZrO_2$ and 18 mol % $Y_2O_3$ and has a lamellar structure. In another example, the plasma resistant coating of $Y_aZr_xAl_yO_z$ contains 63 mol % $Y_2O_3$, 10 mol % $ZrO_2$ and 27 mol % $Er_2O_3$ and has a lamellar structure.

In embodiments, a plasma resistant coating that includes the stress relief layer and the rare-earth metal-containing oxide layer of $Y_2O_3$, $Y_xAl_yO_z$ (e.g., $Y_3Al_5O_{12}$), $Y_xZr_yO_z$, $Y_aZr_xAl_yO_z$, or $Y_xEr_yO_z$ has a low outgassing rate, a dielectric breakdown voltage on the order of about 1000 V/μm, a hermiticity (leak rate) of less than about 1E-8 Torr/s, a Vickers hardness of about 600 to about 950 or about 685, an adhesion of about 75 mN to about 100 mN or about 85 mN as measured by the scratch test and a film stress of about −1000 to −2000 MPa (e.g., about −1140 MPa) as measured by x-ray diffraction at room temperature.

Figure 3B:
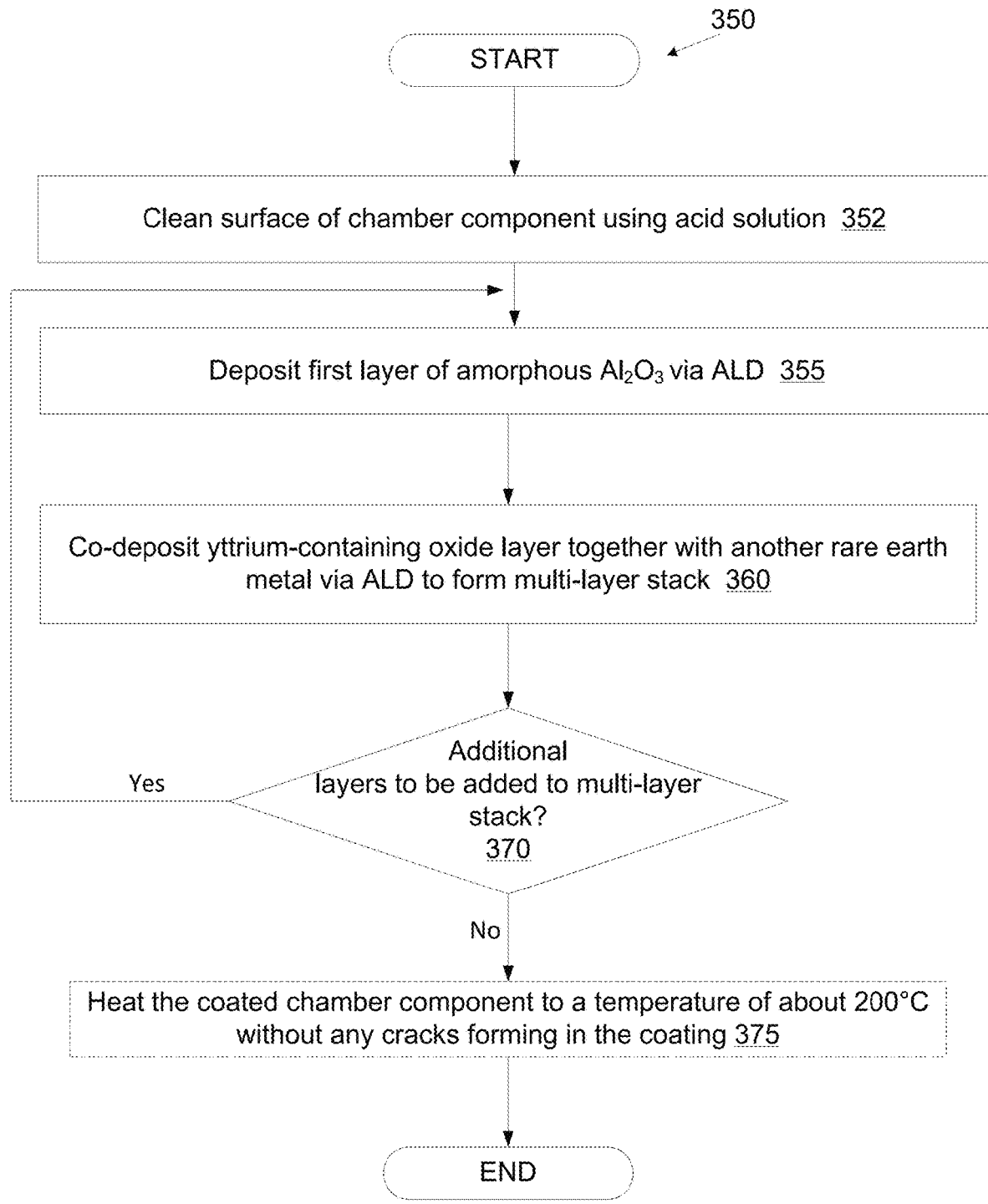
FIG. 3B illustrates a method for creating a plasma resistant coating using atomic layer deposition as described herein.

FIG. 3B illustrates a method 350 for forming a yttrium-containing oxide plasma resistant coating on an aluminum article (e.g., Al6061, or Al6063) such as a process chamber component according to an embodiment. The method may optionally begin by selecting compositions for the plasma resistant coating. The composition selection and method of forming may be performed by the same entity or by multiple entities.

At block 352 of method 350, a surface of the article (e.g., of the process chamber component) is cleaned using an acid solution. The acid solution may be any of the acid solutions described above with reference to block 305 of method 300. The article may then be loaded into an ALD deposition chamber.

Pursuant to block 355, the method comprises depositing a first layer of amorphous $Al_2O_3$ onto a surface of an article via ALD. The amorphous $Al_2O_3$ may have a thickness of about 10 nm to about 1.5 μm. Pursuant to block 360, the method further comprises forming a second layer by co-depositing (i.e., in one step) a mixture of a yttrium-containing oxide precursor and another oxide precursor onto the amorphous $Al_2O_3$ stress relief layer via ALD. The second layer may include $Y_2O_3$ in a single phase with $Al_2O_3$ or $Er_2O_3$ or $ZrO_2$, for example. Alternatively, the second layer may include multiple phases, such as a phase of $Y_4Al_2O_9$ and another phase comprising a solid-solution of $Y_2O_3$—$ZrO_2$ In some embodiments, the stress relief layer may be formed from an aluminum oxide precursor selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum for ALD.

In some embodiments, the rare-earth metal-containing oxide layer is or includes yttria, and the yttrium oxide precursor used to form the rare-earth metal-containing oxide layer may be selected from or include tris(N,N-bis(trimethylsilyl)amide)yttrium (III) or yttrium (III)butoxide for the ALD.

In some embodiments the rare earth metal-containing oxide layer includes zirconium oxide. When the rare-earth metal-containing oxide layer comprises zirconium oxide, a zirconium oxide precursor may include zirconium (IV) bromide, zirconium (IV) chloride, zirconium (IV) tert-butoxide, tetrakis(diethylamido)zirconium (IV), tetrakis(dimethylamido)zirconium (IV), or tetrakis(ethylmethylamido) zirconium (IV) for ALD. One or more of these zirconium oxide precursors may be co-deposited with a yttrium oxide precursor.

In some embodiments, the rare-earth metal-containing oxide layer may further include an erbium oxide. An erbium oxide precursor may be selected from tris-methylcyclopentadienyl erbium(III) ($Er(MeCp)_3$), erbium boranamide (Er $(BA)_3$), $Er(TMHD)_3$, erbium(III)tris(2,2,6,6-tetramethyl-3,5-heptanedionate), or tris(butylcyclopentadienyl)erbium (III) for ALD.

As discussed above, the rare-earth metal-containing oxide layer may include a mixture of multiple different oxides. To form such a rare-earth metal-containing oxide layer, any combination of the aforementioned yttria precursors, erbium oxide precursors, alumina precursors and/or zirconium oxide precursors may be introduced together into an ALD deposition chamber to co-deposit the various oxides and form a layer having a single phase or multiple phases. The ALD deposition or co-deposition may be performed in the presence of ozone, water, O-radicals, or other precursors that may function as oxygen donors.

At block 370, a determination may be made as to whether additional layers are to be added (e.g., if a multi-layer stack is to be formed). If additional layers are to be added, then the method may return to block 355 and an additional layer of $Al_2O_3$ may be formed. Otherwise the method may proceed to block 375.

At block 375, the article (e.g., the chamber component) and both layers of the plasma resistant coating on the chamber component are heated. The heating may be via an annealing process, a thermal cycling process and/or via a manufacturing step during semiconductor processing. In one embodiment, the thermal cycling process is performed on coupons as a check after manufacture to detect cracks for quality control, where the coupons are cycled to the highest temperature that a part may experience during processing. The thermal cycling temperature depends on a specific application or applications that the part will be used for. For a thermal pie, for example (shown in FIG. 4C), coupons may be cycled between room temperature and 250° C. The temperature may be selected based on the material of construction of the article, surface, and film layers so as to maintain their integrity and refrain from deforming, decomposing, or melting any or all of these components.

Figure 4A:
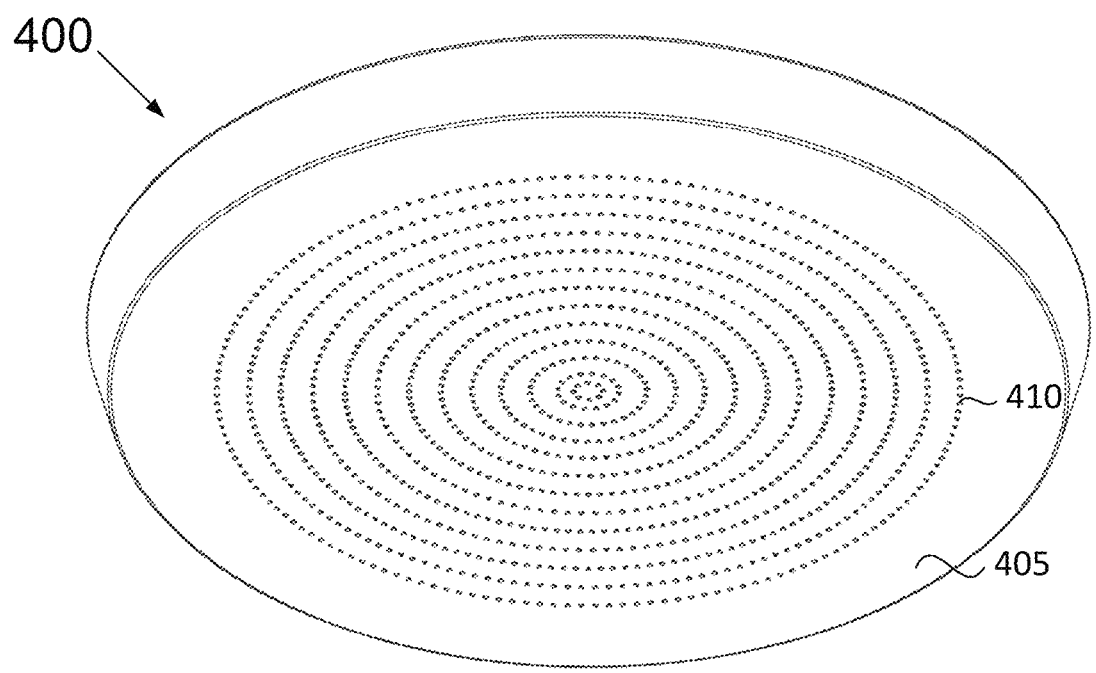
FIG. 4A depicts a showerhead chamber component, in accordance with embodiments.
Figure 4B:
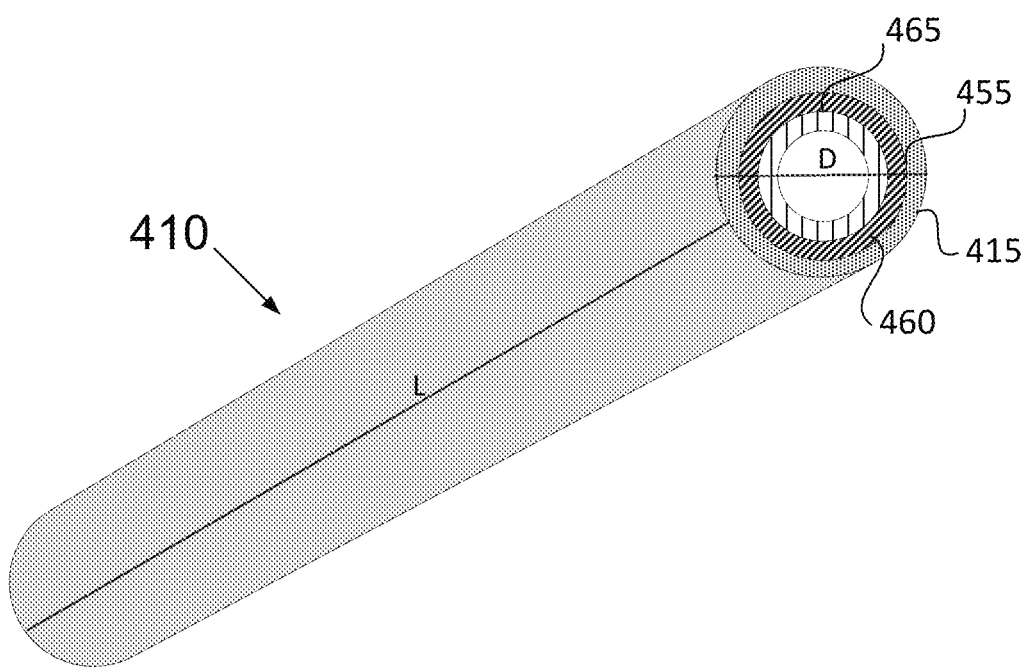
FIG. 4B depicts a blown up view of a gas conduit, wherein an interior of the gas conduit is coated with a plasma resistant coating as described herein.
Figure 4C:
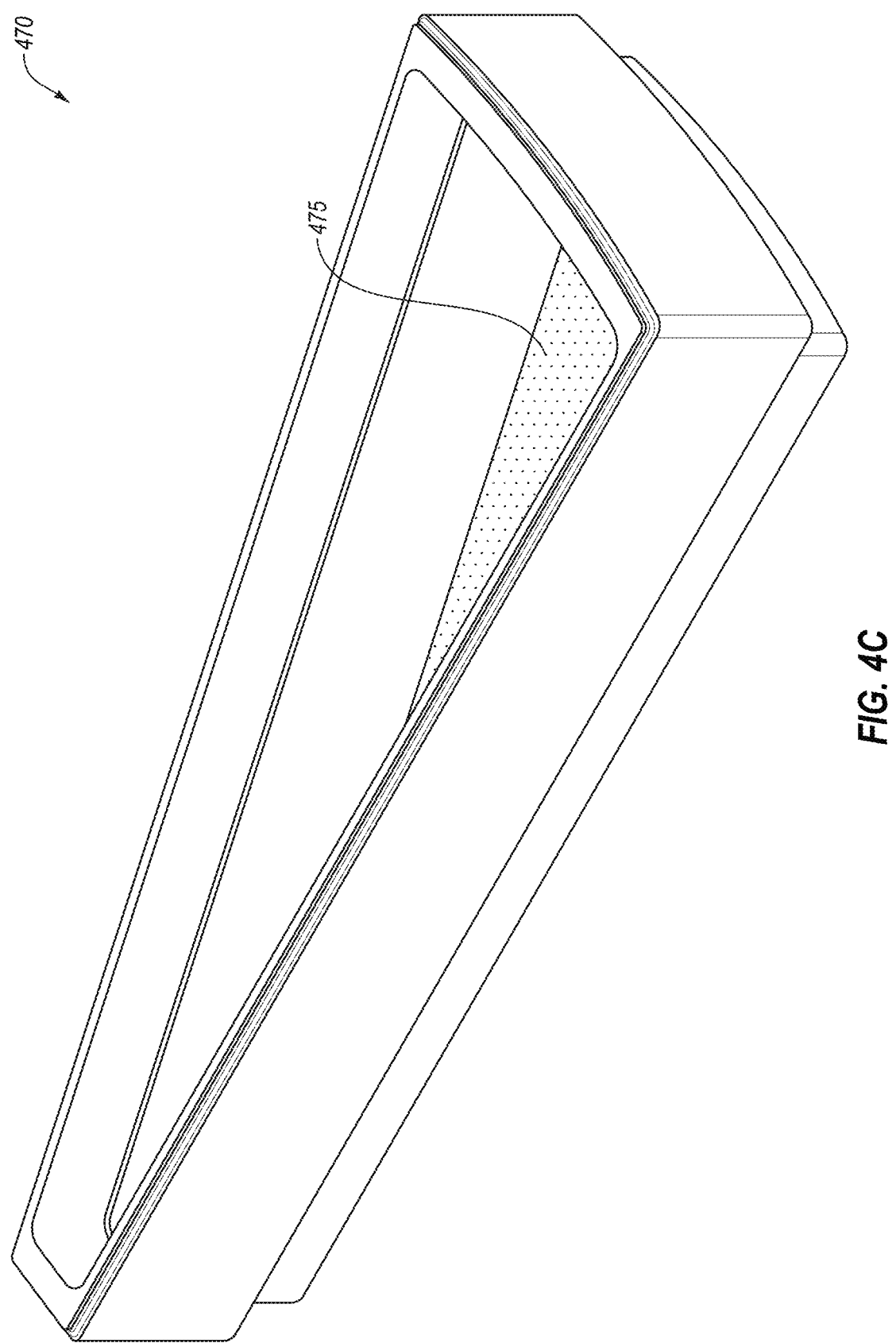
FIG. 4C depicts a thermal pie chamber component, in accordance with embodiments.

FIGS. 4A-4C depict variations of a plasma resistant coating according to different embodiments. FIG. 4A illustrates a multi-layer plasma resistant coating for a surface 405 of an article 410 according to an embodiment. Surface 405 may be the surface of various articles 410. For example, articles 410 may include various semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on. The semiconductor process chamber component may be made from a metal (such as aluminum, stainless steel), a ceramic, a metal-ceramic composite, a polymer, a polymer ceramic composite, or other suitable materials, and may further comprise materials such as AlN, Si, SiC, $Al_2O_3$, $SiO_2$, and so on.

In FIG. 4A, the bi-layer coating composition comprises a stress relief layer of an amorphous aluminum oxide coated onto surface 405 of article 410 using an ALD process and a rare-earth metal-containing oxide layer coated onto the stress relief layer of article 410 using an ALD process.

FIG. 4A illustrates a bottom view of a showerhead 400. The showerhead example provided below is just an exemplary chamber component whose performance may be improved by the use of the plasma resistant coating as set forth in embodiments herein. It is to be understood that the performance of other chamber components may also be improved when coated with the plasma resistant coating disclosed herein. The showerhead 400, as depicted here, was chosen as an illustration of a semiconductor process chamber component having a surface with complex geometry and holes with high aspect ratios.

The complex geometry of lower surface 405 may receive a plasma resistant coating according to embodiments herein. Lower surface 405 of showerhead 400 defines gas conduits 410 arranged in evenly distributed concentric rings. In other embodiments, gas conduits 410 may be configured in alternative geometric configurations and may have as many or as few gas conduits as needed depending on the type of reactor and/or process utilized. The plasma resistant coating is grown or deposited on surface 405 and in gas conduit holes 410 using the ALD technique which enables a conformal coating of relatively uniform thickness and zero porosity (i.e., porosity-free) on the surface as well as in the gas conduit holes despite the complex geometry and the large aspect ratios of the holes.

Showerhead 400 may be exposed to corrosive chemistries such as fluorine and may erode due to plasma interaction with the showerhead. The plasma resistant coating may reduce such plasma interactions and improve the showerhead's durability. Conformal coating is important for surfaces exposed to plasma as the coated/uncoated boundaries are prone to arcing in a capacitive-couple plasma environment. The plasma resistant coating deposited with ALD maintains the relative shape and geometric configuration of the lower surface 405 and of the gas conduits 410 so as to not disturb the functionality of the showerhead. Similarly, when applied to other chamber components, the plasma resistant coating may maintain the shape and geometric configuration of the surface it is intended to coat so as to not disturb the component's functionality, provide plasma resistance, and improve erosion and/or corrosion resistance throughout the entire surface.

The resistance of the coating material to plasma is measured through "etch rate" (ER), which may have units of micron/hour (µm/hr), throughout the duration of the coated components' operation and exposure to plasma. Measurements may be taken after different processing times. For example, measurements may be taken before processing, after 50 processing hours, after 150 processing hours, after 200 processing hours, and so on. Variations in the composition of the plasma resistant coating grown or deposited on the showerhead or on any other process chamber component may result in multiple different plasma resistances or erosion rate values. Additionally, a plasma resistant coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma. In embodiments, no detectable etching occurred after exposure to a 200 W $NF_3$ direct plasma at 500 C for 1 hours.

FIG. 4B depicts a blown up view of a gas conduit 410 having a high aspect ratio coated according to an embodiment. Gas conduit 410 may have a length L and a diameter D. Gas conduit 410 may have a high aspect ratio defined as L:D, wherein the aspect ratio may range from about 10:1 to about 300:1. In some embodiments, the aspect ratio may be about 50:1 to about 100:1.

Gas conduit 410 may have an interior surface 455 which may be coated with a plasma resistant coating. The plasma resistant coating may comprise a stress relief layer 460 and a rare earth metal-containing oxide layer 465. The stress relief layer 460 may comprise an amorphous $Al_2O_3$. The rare earth metal-containing oxide layer 465 may comprise a polycrystalline yttrium oxide alone or together with an additional rare earth metal oxide (e.g., erbium oxide, zirconium oxide, etc.). The rare earth metal-containing oxide layer 465 may have any rare earth metal-containing oxide material such as those described herein above. Each layer may be coated using an ALD process. The ALD process may grow conformal coating layers of uniform thickness that are porosity-free throughout the interior surface of gas conduit 410 despite its high aspect ratio while ensuring that the final multi-component coating may also be thin enough so as to not plug the gas conduits in the showerhead.

In some embodiments, each layer may comprise monolayers or thin layers of uniform thickness. Each monolayer or thin layer may have a thickness ranging from about 0.1 nanometers to about 100 nanometers. In other embodiments, the layers may comprise thick layers of uniform thickness. Each thick layer may have a thickness ranging from about 100 nanometers to about 1.5 micrometer. In yet other embodiments, the layers may comprise a combination of monolayers, thin layers and/or thick layers.

FIG. 4C depicts a thermal pie chamber component 470, in accordance with embodiments. The thermal pie chamber component 470 includes a plasma resistant coating as described in embodiments herein. A thermal pie is one of eight mutually isolated showerheads used in a spatial ALD chamber. Some of the eight showerheads are plasma pies and some are thermal pies. Wafers are positioned under these showerheads during processing, and move past each of them and get exposed to different chemicals and plasmas that these showerheads provide sequentially. In one embodiment, the thermal pie has 10:1 aspect ratio holes 475 and is exposed to harsh chemicals.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing method 300 or method 350 described above.

EXAMPLE 1

Forming an $Al_2O_3$ Stress Relief Layer on an Al 6061 Substrate and Coating the Stress Relief Layer with a $Y_2O_3$-containing Coating A plasma resistant coating was deposited on an aluminum substrate of Al 6061 (e.g., at a temperature of about room temperature to about 300° C.). A stress relief layer of amorphous aluminum oxide was deposited on the aluminum substrate using atomic layer deposition. The precursor for the stress relief layer was introduced to the substrate at a pressure on the scale of one or a few mtorr to one or a few torr and a temperature of about 100-250° C. Subsequently, a polycrystalline yttrium-containing oxide layer was deposited on the stress relief layer using atomic layer deposition. The precursor for the yttrium-containing oxide layer was introduced to the substrate at a pressure on the scale of one or a few mtorr to one or a few torr and a temperature of about 100-250° C.

The resulting plasma resistant coating on the aluminum substrate was characterized using inter alia transmission electron microscopy. The thickness of the stress relief layer was about 5 nm to about 15 nm and the thickness of the yttrium-containing oxide layer was about 90 nm to about 110 nm.

Selective area diffraction and Convergence beam electron diffraction was used to determine the structure of the material in each layer. The aluminum oxide in the stress relief layer had an amorphous structure whereas the yttrium-containing oxide layer had a polycrystalline structure. The aluminum substrate both pre- and post-coating was characterized using scanning electron microscopy (SEM). The SEM images showed that the plasma resistant coating covered all of the features on the aluminum substrate.

The breakdown voltage of the coated substrate was also measured. The breakdown voltage was from about 305 to about 560 for 1 μm yttria. In embodiments, the breakdown voltage of the plasma resistant ceramic coating is lower than an intrinsic breakdown voltage for the ceramics used to form the plasma resistant ceramic coating. The coated substrate was also exposed to a $NF_3$ direct plasma at 500° C., 200 W. No observable etching or surface deterioration was observed due to reaction with the $NF_3$ plasma.

The coated substrate was also subjected to five (5) thermal cycles at 200° C. SEM images showed that there were no cracks in the coating whereas with conventional plasma spray or ion assisted deposition coatings, cracks would be observed. The hardness of the coated substrate was also evaluated. The substrate had a Vickers hardness of about 500 to about 830 or about 626.58±98.91, or of about 5,500 MPa to about 9,000 MPa or about 6,766±1,068. The coated substrate had a Young's modulus of about 75 GPa to about 105 GPa or about 91.59±8.23 GPa. The coated substrate exhibited a maximum hardness at about 0.110 μm to about 0.135 μm or about 0.125±0.007 μm.

The adhesion of the coating to the aluminum substrate was measured by a scratch test. The first delamination Lc occurred at about 75 to about 100 mN or about 85.17±9.59. The film stress of the coated substrate was measured by x-ray diffraction at room temperature. The film stress was about −1140 MPa or about −165.4 (KSi).

Figure 5:
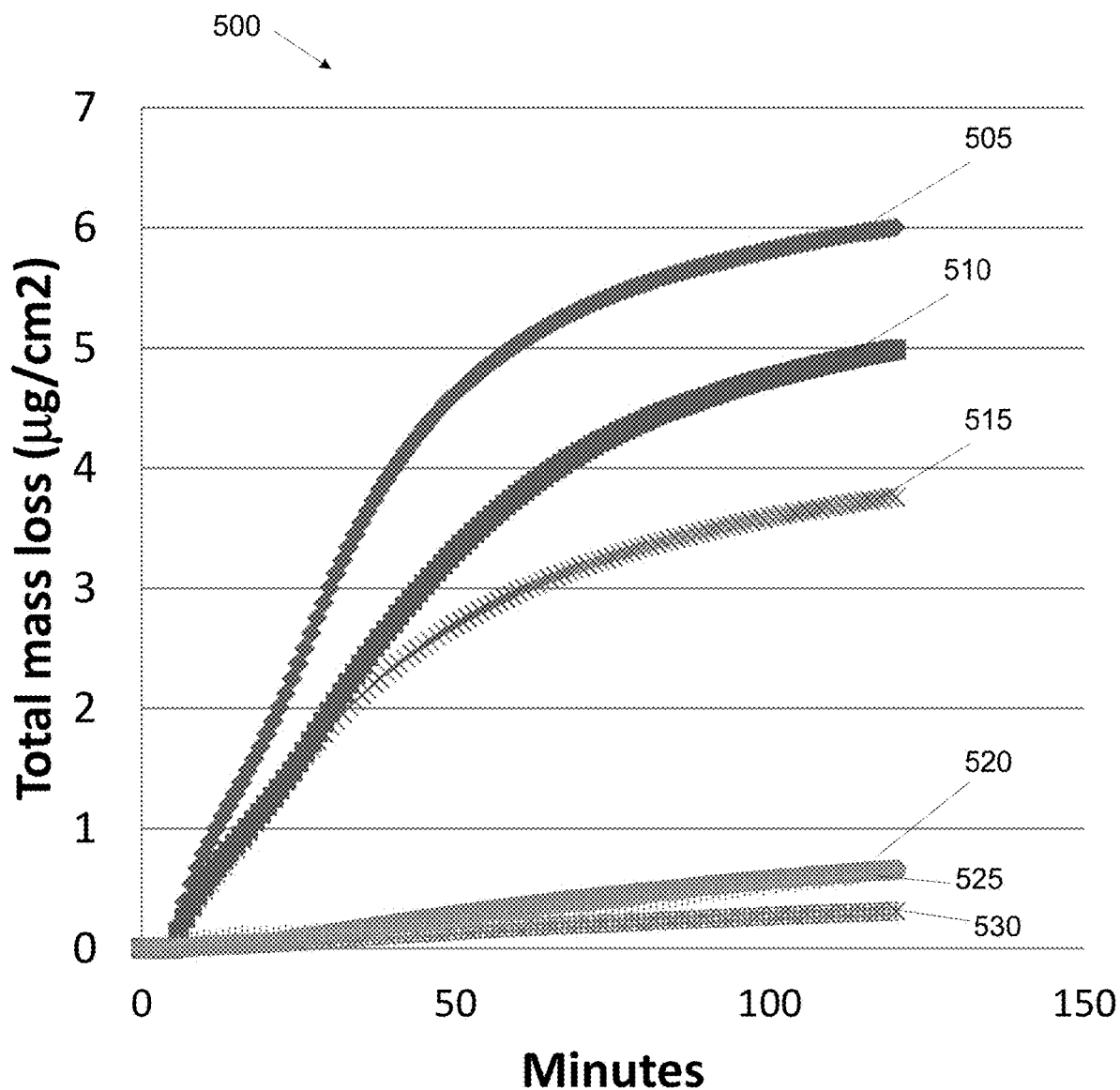
FIG. 5 is a chart comparing outgassing in total mass loss (µg/cm$^2$) per minute for different materials.

FIG. 5 shows the results 500 of an outgassing comparison test at 125° C. in total mass loss (μg/cm$^2$) as a function of time (minutes). The following materials were compared: a bulk yttria material with a three (3) hour bake 505, a polysilicon and yttria material with a three (3) hour bake 510, a Dura HPM material with a three (3) hour bake 515, a Bare SST material with a three (3) hour bake 520, aluminum oxide deposited on aluminum 1500 nm as coated using ALD 525 and a Parylene® HT on a stainless steel (SST) material 530. As shown in FIG. 5, the alumina deposited on aluminum 525 had a relatively low outgassing.

EXAMPLE 2

Figure 6:
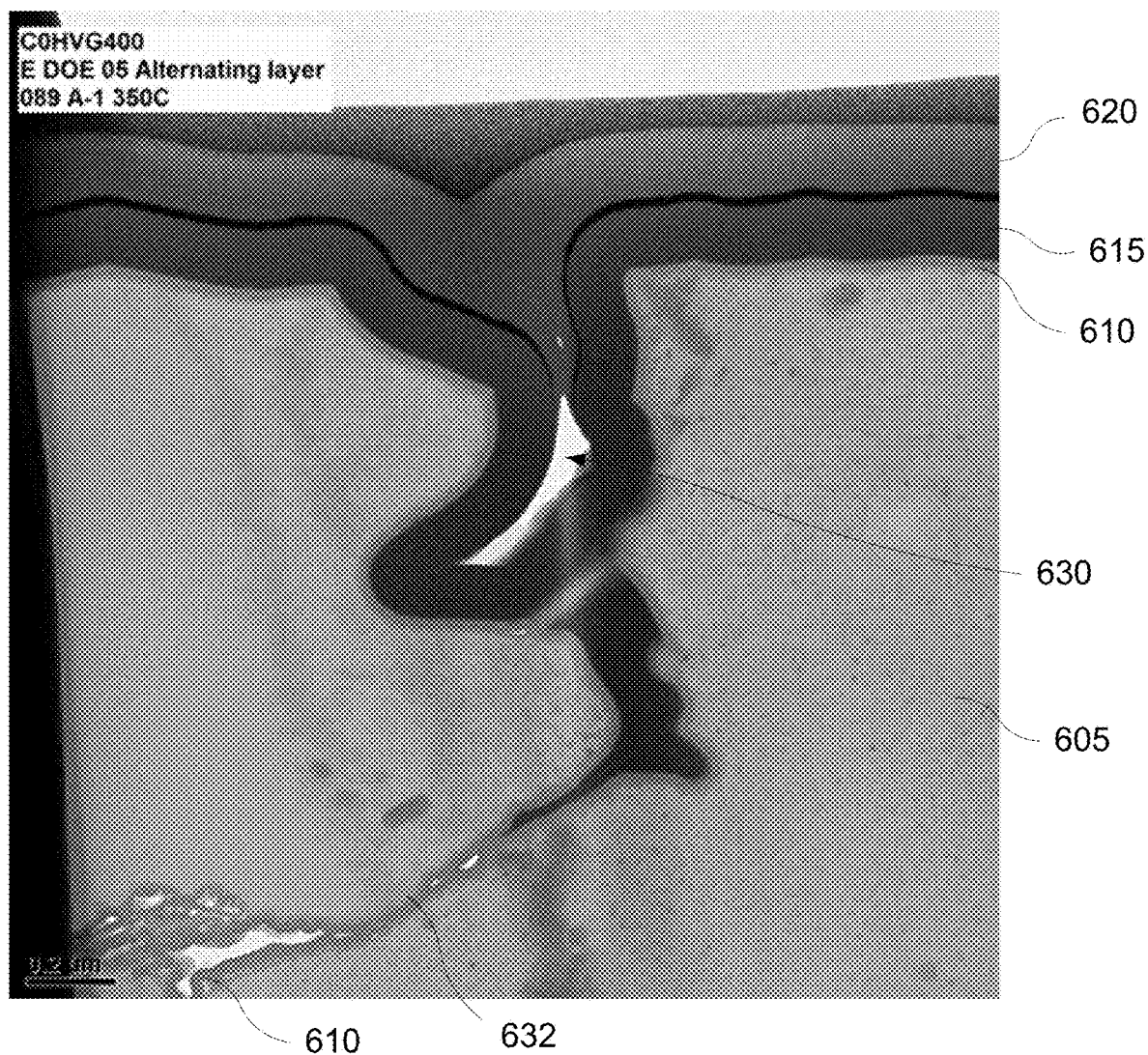
FIG. 6 is an image of a plasma resistant coating as described herein on a component having a high aspect ratio feature.

Plasma Resistant Coating Having Rare-earth Oxide-containing Layer with $Y_2O_3/Al_2O_3$ Alternating Sub-layers Over $Al_2O_3$ Layer on an Al 6061 Substrate after 350° C. Thermal Cycling FIG. 6 shows an image of a coated substrate 605 as generated by transmission electron spectroscopy (TEM). The substrate 605 was comprised of aluminum (Al6061). A stress relief layer 610 of amorphous aluminum oxide was deposited on the substrate 605 using ALD. A rare earth oxide-containing layer 615 that includes alternating $Y_2O_3$ and $Al_2O_3$ sublayers was deposited over the stress relief layer 610. The substrate 605 includes a pit 630. As shown, the layers 610, 615 provide conformal coverage of the pit 630. For example, a channel 632 in the pit 630 was sealed by the stress relief layer 610. A remainder of the pit 630 was then sealed by the rare-earth metal-containing oxide layer 615. The substrate 605 with the stress relief layer 610 and rare-earth metal-containing oxide layer 615 was then subjected to thermal cycling at 350° C. without any cracking or delamination. A capping layer 620 is shown, which is placed on the sample for the TEM image. However, the capping layer 620 is not used for production parts.

FIG. 7A depicts a top down SEM image of a plasma resistant coating as described herein. FIG. 7B depicts a TEM cross sectional image of the plasma resistant coating of FIG. 7A. The images include a top down image 705 and a cross sectional side view image 710 taken from a coupon cut out from a region 708 depicted in the top down image. As shown in the cross sectional side view image 710, an article 715 includes a plasma resistant coating that includes a stress relief layer 720 and a rare earth oxide layer 725. The rare earth oxide layer has a thickness of about 600 nm and the stress relief layer has a thickness of about 200 nm. The TEM images were taken after thermal cycling was performed between room temperature and temperatures of 200° C. As shown, no cracking occurred in the plasma resistant coating as a result of the thermal cycling and the plasma resistant coating is not delaminating from the article. Similar tests have shown corresponding results of no cracking or delamination after thermal cycling of 250° C. and 300° C.

FIG. 8A depicts a top down SEM image of an ALD coating 804 of $Y_2O_3$ without an $Al_2O_3$ stress relief layer on an article. FIG. 8B depicts a cross sectional image of the ALD coating 804 of FIG. 8A on the article 802. As shown, cracks 805 formed in the $Y_2O_3$ coating 804 after thermal cycling.

FIG. 9 illustrates a cross sectional side view TEM image of a plasma resistant ceramic sample as described with regards to FIG. 2C. The sample was imaged with a FEI Tecnai TF-20 FEG/TEM operated at 200 kV in bright-field (BF) TEM mode. As shown, the sample includes an article 910 with a plasma resistant coating that includes a stress relief layer 915 having a thickness of about 20 nm and rare-earth metal-containing oxide layer 920 that includes a stack of alternating sub-layers, the stack having a thickness of about 134 nm. A crystalline contrast from the particles can be seen in the stack 920 of alternating layers. However, the stack 920 of alternating layers is mostly amorphous with short range order in the illustrated TEM image.

FIG. 10 is a scanning transmission electron microscopy energy-dispersive x-ray spectroscopy (STEM-EDS) line scan of the plasma resistant ceramic sample shown in FIG. 9. As shown, the article 910 is aluminum 6061 substrate. The stress relief layer 915 includes about 60-80 atom % oxygen 1010 and about 20-40 atom % aluminum 1025. The rare-earth metal-containing oxide layer 920 is composed primarily of oxygen 1010 and yttrium 1015, with about 5 atom % aluminum.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

We claim:
1. A method comprising:
 depositing a plasma resistant coating onto a surface of a chamber component using an atomic layer deposition (ALD) process, comprising:
 depositing a first layer comprising amorphous $Al_2O_3$ on the surface to a thickness of about 10 nm to about 1.5 μm using the ALD process; and
 depositing a second layer comprising a solid solution of $Y_2O_3$—$ZrO_2$ to a thickness of about 10 nm to about 1.5 μm on the first layer using the ALD process, wherein depositing the second layer comprises co-depositing $Y_2O_3$ and $ZrO_2$ to form a phase comprising the solid solution of $Y_2O_3$—$ZrO_2$ by:

performing a deposition cycle comprising:
co-injecting a mixture of a first precursor for the $Y_2O_3$ and a second precursor for the $ZrO_2$ into a deposition chamber containing the chamber component to cause the first precursor and the second precursor to adsorb onto a surface of the first layer; and
injecting an oxygen-containing reactant into the deposition chamber to cause the oxygen-containing reactant to react with the first precursor and the second precursor and form the phase comprising the solid solution of $Y_2O_3$—$ZrO_2$; and
repeating the deposition cycle one or more times until a target thickness is reached,
wherein the plasma resistant coating uniformly covers the surface of the chamber component, is resistant to cracking and delamination at a temperature of up to 350° C. and is porosity-free.

2. The method of claim 1, wherein depositing the first layer comprises:
performing a deposition cycle comprising:
injecting an aluminum-containing precursor into a deposition chamber containing the chamber component to cause the aluminum-containing precursor to adsorb onto the surface of the chamber component; and
injecting an oxygen-containing reactant into the deposition chamber to cause the oxygen-containing reactant to react with the aluminum-containing precursor and form $Al_2O_3$; and
repeating the deposition cycle one or more times until a target thickness is achieved for the first layer.

3. The method of claim 1, wherein the second layer comprises a mixture of about 10-90 mol % $Y_2O_3$ and about 10-90 mol % $ZrO_2$.

4. The method of claim 1, wherein the second layer comprises a mixture of about 40-80 mol % $Y_2O_3$ and about 20-60 mol % $ZrO_2$.

5. The method of claim 1, wherein the second layer comprises a mixture of about 60-70 mol % $Y_2O_3$ and about 30-40 mol % $ZrO_2$.

6. The method of claim 1, wherein the surface of the chamber component onto which the plasma resistant coating is deposited has an aspect ratio of length to width of about 10:1 to about 300:1, and wherein the plasma resistant coating uniformly covers the surface.

7. The method of claim 1, wherein the chamber component is a chamber component for a semiconductor processing chamber selected from a group consisting of a chamber wall, a shower head, a plasma generation unit, a diffuser, a nozzle, and a gas line.

8. The method of claim 1, wherein the second layer comprises $Y_4Al_2O_9$ and the solid solution of $Y_2O_3$—$ZrO_2$.

9. A method comprising:
depositing a stack of alternating layers of a first material comprising a solid solution of $Y_2O_3$—$ZrO_2$ and a second material comprising an amorphous oxide onto a surface of a chamber component using an atomic layer deposition (ALD) process by:
performing 1-30 cycles of the ALD process using one or more first precursors to deposit the first material comprising the solid solution of $Y_2O_3$—$ZrO_2$, wherein depositing one of the layers of the first material comprises co-depositing $Y_2O_3$ and $ZrO_2$ to form a phase comprising the solid solution of $Y_2O_3$—$ZrO_2$ by:
performing a deposition cycle comprising:
co-injecting a mixture of a first precursor for the $Y_2O_3$ and a second precursor for the $ZrO_2$ into a deposition chamber containing the chamber component to cause the first precursor and the second precursor to adsorb onto a surface of the chamber component; and
injecting an oxygen-containing reactant into the deposition chamber to cause the oxygen-containing reactant to react with the first precursor and the second precursor and form the phase comprising the solid solution of $Y_2O_3$—$ZrO_2$;
performing 1-2 cycles of the ALD process using a second precursor to deposit the second material comprising the amorphous oxide; and
alternately repeating the 1-30 cycles of the ALD process using the one or more first precursors to deposit the first material and the 1-2 cycles of the ALD process using the second precursor to deposit the second material;
wherein the stack of alternating layers has a thickness of about 10 nm to about 1.5 μm, and wherein the layers of the second material prevent crystal formation in the layers of the first material.

10. The method of claim 9, further comprising:
depositing an amorphous $Al_2O_3$ layer on the surface using a plurality of cycles of the ALD process to a thickness of about 10 nm to about 1.5 μm prior to depositing the stack of alternating layers.

11. The method of claim 9, wherein the amorphous oxide comprises amorphous $Al_2O_3$.

12. The method of claim 9, wherein depositing one of the layers of the first material comprises alternating deposition of $Y_2O_3$ and $ZrO_2$ by:
performing one more deposition cycles comprising:
injecting a yttrium-containing precursor into a deposition chamber containing the chamber component to cause the yttrium-containing precursor to adsorb onto a surface of the chamber component; and
injecting an oxygen-containing reactant into the deposition chamber to cause the oxygen-containing reactant to react with the yttrium-containing precursor and form a sublayer of $Y_2O_3$;
performing one more additional deposition cycles comprising:
injecting a zirconium-containing precursor into the deposition chamber to cause the zirconium-containing precursor to adsorb onto a surface of the sublayer of $Y_2O_3$; and
injecting the oxygen-containing reactant or an alternative oxygen-containing reactant into the deposition chamber to cause the oxygen-containing reactant or the alternative oxygen-containing reactant to react with the zirconium-containing precursor and form a sub-layer of $ZrO_2$.

13. The method of claim 12, further comprising:
annealing the chamber component to cause the sub-layer of $Y_2O_3$ and the sub-layer of $ZrO_2$ to interdiffuse and form a phase comprising the solid solution of $Y_2O_3$—$ZrO_2$.

14. The method of claim 9, wherein the first material comprises a mixture of about 10-90 mol % $Y_2O_3$ and about 10-90 mol % $ZrO_2$.

15. The method of claim 9, wherein the first material comprises a mixture of about 40-80 mol % $Y_2O_3$ and about 20-60 mol % $ZrO_2$.

16. The method of claim 9, wherein the first material comprises a mixture of about 60-70 mol % $Y_2O_3$ and about 30-40 mol % $ZrO_2$.

* * * * *